(12) United States Patent
Sugiyama

(10) Patent No.: US 8,106,414 B2
(45) Date of Patent: Jan. 31, 2012

(54) SEMICONDUCTOR LIGHT EMITTING DEVICE

(75) Inventor: Takafumi Sugiyama, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 144 days.

(21) Appl. No.: 11/943,243

(22) Filed: Nov. 20, 2007

(65) Prior Publication Data

US 2008/0116473 A1 May 22, 2008

(30) Foreign Application Priority Data

Nov. 21, 2006 (JP) ................................. 2006-314738
Sep. 5, 2007 (JP) ................................. 2007-230835

(51) Int. Cl.
*H01L 33/00* (2010.01)
(52) U.S. Cl. ........ 257/98; 257/99; 257/100; 257/E33.07
(58) Field of Classification Search ................... 257/98, 257/99, 100, E33.07
See application file for complete search history.

(56) References Cited

U.S. PATENT DOCUMENTS

| | | | | |
|---|---|---|---|---|
| 5,130,531 | A | * | 7/1992 | Ito et al. ........................ 250/216 |
| 5,500,768 | A | * | 3/1996 | Doggett et al. ................. 359/652 |
| 7,019,335 | B2 | | 3/2006 | Suenaga |
| 7,190,003 | B2 | * | 3/2007 | Isoda ................................. 257/98 |
| 2003/0231679 | A1 | | 12/2003 | Umemoto et al. |
| 2006/0186425 | A1 | * | 8/2006 | Yano et al. ........................ 257/98 |
| 2008/0278954 | A1 | * | 11/2008 | Speier ............................. 362/373 |

FOREIGN PATENT DOCUMENTS

| | | |
|---|---|---|
| JP | 57-192096 | 11/1982 |
| JP | 58-007887 | 1/1983 |
| JP | 07-099345 | 4/1995 |
| JP | 07-176825 | 7/1995 |
| JP | 2002-270952 | 9/2002 |
| JP | 2005-283563 | 10/2005 |

OTHER PUBLICATIONS

Extended European Search Report for corresponding EP Application No. 07121095.9-2222, Mar. 2, 2011.

* cited by examiner

*Primary Examiner* — Tan N Tran
(74) *Attorney, Agent, or Firm* — Ditthavong Mori & Steiner, P.C.

(57) ABSTRACT

A semiconductor light emitting device is provided which allows emission light from a light source to efficiently outgo from the semiconductor light emitting device so that the light emission intensity of the semiconductor light emitting device is increased. A penetrating opening is formed in the substantially central part of a cap member to communicate the interior side to the exterior side the cap member. The penetrating opening has an inclined portion. The inclined portion is opposed to and spaced away from a semiconductor light emitting element and includes a light entering portion through which emission light from the semiconductor light emitting element passes. The opening width of the inclined portion is getting wider from the light entering portion in the light traveling direction so that the inclined portion is tapered. The emission light from the semiconductor light emitting element can effectively outgo from the semiconductor light emitting device.

25 Claims, 14 Drawing Sheets

PRIOR ART

PRIOR ART

SEMICONDUCTOR LIGHT EMITTING DEVICE

BACKGROUND OF THE INVENTION

1. Technical Field

The present invention relates to a semiconductor light emitting device that includes a semiconductor light emitting element, and in particular to a semiconductor light emitting device that allows light from a light source to efficiently outgo from the semiconductor light emitting device.

2. Description of Related Art

In semiconductor light emitting devices, it has been an important issue to allow light to efficiently outgo from a semiconductor light emitting element as a light source. Accordingly, various types of light emitting devices have been developed. FIG. 25(a) shows a known LED light emitting device 200 (see Japanese Laid-Open Patent Publication No. H07-099345 (1995)). The LED light emitting device 200 is configured to entirely seal a semiconductor light emitting device with a resin member. The semiconductor light emitting member includes a lead frame 202 that includes a cup 203, and an LED 204 that is mounted on the cup 204. Also, the sealing resin member includes a resin material 211 that fills up the interior of the cup 203, and a resin material 212 that entirely encloses the cup 203 including the resin material 211. The resin material 211 that fills up the interior of the cup 203 includes a phosphor material 205 that converts the wavelength of light that is emitted by the LED 204 into a different wavelength, or absorbs a part of the wavelength range light of that is emitted by the LED 204.

Also, FIG. 25(b) is an enlarged schematic cross-sectional view showing a portion of the cup 203 of the LED light emitting device 200 shown in FIG. 25(a). As shown in FIGS. 25(a) and 25(b), the wavelength of emission light from the LED 204 is converted by the resin material 211. Although the converted light is scattered in all directions, most converted light is reflected inside the cup, and is gathered toward the light observation surface side. That is, the light-gathering rate of the converted light is improved.

However, in the thus-configured light emitting device, there is a problem in that a part of light that is reflected inside the cup 203 as return light is incident on the LED 204, and is absorbed by the LED 204. This return light deteriorates the characteristics of the LED 204, and causes reduction of output light and deterioration of the life characteristics of the LED 204.

Also, in order that the LED 204 may be mounted to a mount surface 203a of the cup 203, and that light from the side surface of the LED 204 may be reflected on an inclined surface 203b of the case 203, the area of the mount surface 203a of the case is required to be larger than the bottom surface of the LED 204. In addition to this, the depth of the cup 203 is required to be deep. The reason is to require for the inclined surface 203b of the cup to have a large area in order to reflect emission light from the side surface of the LED 204 inside the cup 203. In addition to this, in order to prevent that light that entering the LED light emitting device 200 from the outside reaches the phosphor material 205, the resin material 211 containing the phosphor material 205 should not bulge out of the cup. For this reason, the cup 203 necessarily has an enough height to surround the side surface of LED 204. Accordingly, the cup 203 is required to be large.

FIG. 26 is a schematic cross-sectional view showing a known laser diode (LD) light emitting device as a semiconductor light emitting device (see FIG. 4 in Japanese Patent Laid-Open Publication No. 2002-270952, and Japanese Laid-Open Patent Publication No. H07-176825 (1995)). In an LD light emitting device 100, an LD 104 is mounted to the side surface of a bar-shaped stem member 102 that is coupled to the upper surface of the stem base 101. The LD 104 is electrically connected to a lead 108 that extends from the lower surface of the stem base 101. Thus, the LD 104 can be connected to an exterior terminal via the lead 108.

The LD light emitting device 100 further includes a cylindrical cap 103 that is arranged on the peripheral portion of the upper surface of the stem base 101. The bar-shaped stem member 102 and the LD 104 are arranged inside the cap 103. The cap 103 has an annular upper surface 103a as the top of the cap 103. An opening 105 is formed in the central part of the upper surface 103a. The opening 105 of the cap penetrates the upper surface 103a of the cap in the vertical direction. The width of the penetrating opening is constant. Also, glass 113 is adhered on the bottom surface of the upper surface 103a of the cap. Thus, the opening 105 of the cap is closed.

In the thus-configured LD light emitting device 100, emission light from the LD 104 passes through the glass 113 and the opening 105 of the cap, and then outgoes from the cap 103. However, there is a problem in that a part of light that travels in the opening 105 of the cap returns toward the LD 104 as return light after being reflected on the wall surface of the opening 105 one time or a plurality of times repeatedly. This may cause reduction of light outgoing efficiency. In addition to this, the return light may cause deterioration of the characteristics of the LD 104.

The present invention is devised to solve the above problems. It is an important object is to provide a semiconductor light emitting device that allows emission light from a semiconductor light emitting element to efficiently outgo from the semiconductor light emitting device so that the light emission intensity of the semiconductor light emitting device is increased.

SUMMARY OF THE INVENTION

To achieve the above object, a semiconductor light emitting device according to a first aspect of the present invention includes a semiconductor light emitting element, a mount that is provided with the semiconductor light emitting element mounted thereon, and a cap that includes a transparent member that allows emission light from the semiconductor light emitting element to pass therethrough, and a cap member that supports the transparent member. In this semiconductor light emitting device, the semiconductor light emitting element is sealed by the mount and the cap. The cap member is provided with a penetrating opening that has an inclined portion so that the penetrating opening is getting wider toward the outside from the inside where semiconductor light emitting element is mounted, and the transparent member is arranged in or outside the inclined portion.

In a semiconductor light emitting device according to a second aspect of the present invention, the transparent member can contain a wavelength conversion material that absorbs the emission light from the semiconductor light emitting element and converts the wavelength of the emission light, or a light scattering material that scatters the emission light from the semiconductor light emitting element.

In a semiconductor light emitting device according to a third aspect of the present invention, the semiconductor light emitting element can be spaced away from the cap.

In a semiconductor light emitting device according to a fourth aspect of the present invention, the minimum of the cross-section area of the penetrating opening in the inclined portion of the cap member falls within the following range $$\pi \times \left\{ (L-0.2) \times \tan\frac{(R-10)}{2} \right\}^2 \le A \le \pi \times \left\{ (L+0.2) \times \tan\frac{(R+10)}{2} \right\}^2$$

where A is the minimum of the cross-section area of the penetrating opening in the inclined portion of the cap member, L is the distance between the semiconductor light emitting element and the cap member, and R is the angle of divergence of the emission light from the semiconductor light emitting element. "The angle of divergence of the emission light from the semiconductor light emitting element" refers to the angular spread of a light beam corresponding to $1/e^2$ of the peak intensity of the light beam.

In a semiconductor light emitting device according to a fifth aspect of the present invention, the inclined portion is formed in a substantially inverted truncated cone shape.

In a semiconductor light emitting device according to a sixth aspect of the present invention, the transparent member is fitted in the inclined portion that is arranged in the cap member.

In a semiconductor light emitting device according to a seventh aspect of the present invention, the semiconductor light emitting element is a semiconductor laser element or an end surface light emission type LED.

In a semiconductor light emitting device according to an eighth aspect of the present invention, the transparent member is formed in a substantially truncated cone shape, a substantially dome shape or a substantially disk shape, and the cap includes a plurality of layered portions. In addition to this, the transparent member is fastened by the plurality of layered portions.

In a semiconductor light emitting device according to a ninth aspect of the present invention, the semiconductor light emitting device further includes a cap cover that covers the transparent member.

Furthermore, a semiconductor light emitting device according to a tenth aspect of the present invention includes a semiconductor light emitting element, a mount that is provided with the semiconductor light emitting element mounted thereon, and a cap that includes a transparent member that allows emission light from the semiconductor light emitting element to pass therethrough, and a cap member that supports the transparent member. The semiconductor light emitting element is sealed by the mount and the cap. The cap member is provided with a penetrating opening that opens to allow emission light emitted from the semiconductor light emitting element to outgo. The transparent member is arranged in or outside the penetrating opening. The transparent member contains a wavelength conversion material that absorbs the emission light from the semiconductor light emitting element and converts the wavelength of the emission light, or a light scattering material that scatters the emission light from the semiconductor light emitting element. Of emission light that is emitted from the semiconductor light emitting element, the ratio of a part of the emission light that does not outgo from the semiconductor light emitting device caused by reflection, absorption and/or scatter in the transparent member is not more than 22%.

Furthermore, a semiconductor light emitting device according to an eleventh aspect of the present invention includes a semiconductor light emitting element, a mount that is provided with the semiconductor light emitting element mounted thereon, and a cap that includes a transparent member that allows emission light from the semiconductor light emitting element to pass therethrough, and a cap member that supports the transparent member. The semiconductor light emitting element is sealed by the mount and the cap. The cap member is provided with a penetrating opening that opens to allow emission light emitted from the semiconductor light emitting element to outgo. The transparent member is arranged in or outside the penetrating opening. The transparent member contains a wavelength conversion material that absorbs the emission light from the semiconductor light emitting element and converts the wavelength of the emission light, or a light scattering material that scatters the emission light from the semiconductor light emitting element. Of the emission light that is emitted from the semiconductor light emitting element, the ratio of a loss caused by the cap member and the transparent member is not more than 65%.

According to the semiconductor light emitting device according to the first aspect of the present invention, in the case where the emission light from the semiconductor light emitting element passes through a light entering portion and travels in the penetrating opening, if the light is reflected by the wall surface of the penetrating opening, the reflected light is less likely to pass through the light entering portion and to return to the semiconductor light emitting element. Therefore, it is possible to remarkably reduce the return light that returns to the semiconductor light emitting element, and to improve the light outgoing efficiency from the light source.

According to the semiconductor light emitting device of the second aspect of the present invention, it is possible to provide a semiconductor light emitting device that can emit light with a desired wavelength or chromaticity.

According to the semiconductor light emitting device of the third aspect of the present invention, heat that is generated by the semiconductor light emitting element is less likely to be conducted to the cap or the wavelength conversion material. Therefore, it is possible to prevent deterioration of the characteristics of the wavelength conversion material.

According to the semiconductor light emitting device of the fourth aspect of the present invention, it is possible to reduce return light that returns to the semiconductor light emitting element, that is, to provide a light guide that allows light to pass only in one direction.

In the semiconductor light emitting device of the fifth aspect of the present invention, since the inclination angle of the wall surface of the penetrating opening is constant, it is easy to form the penetrating opening.

According to the semiconductor light emitting device of the sixth, eighth or ninth aspect of the present invention, the shock resistance of the semiconductor light emitting device is improved.

In the seventh aspect of the present invention, since the semiconductor light emitting element with high directivity is used, it is possible to provide a semiconductor light emitting device with further improved light outgoing efficiency.

According to the tenth or eleventh aspect of the present invention, the semiconductor light emitting device reduces the loss caused by a return light part that is reflected inside the semiconductor light emitting device and does not outgo from the semiconductor light emitting device, or the loss inside the semiconductor light emitting device including the loss caused by the return light part. Therefore, it is possible to increase emission light, and to suppress deterioration of the characteristics of the semiconductor light emitting element and the like caused by return light.

DETAILED DESCRIPTION OF THE PREFERRED EMBODIMENTS

Figure 1:
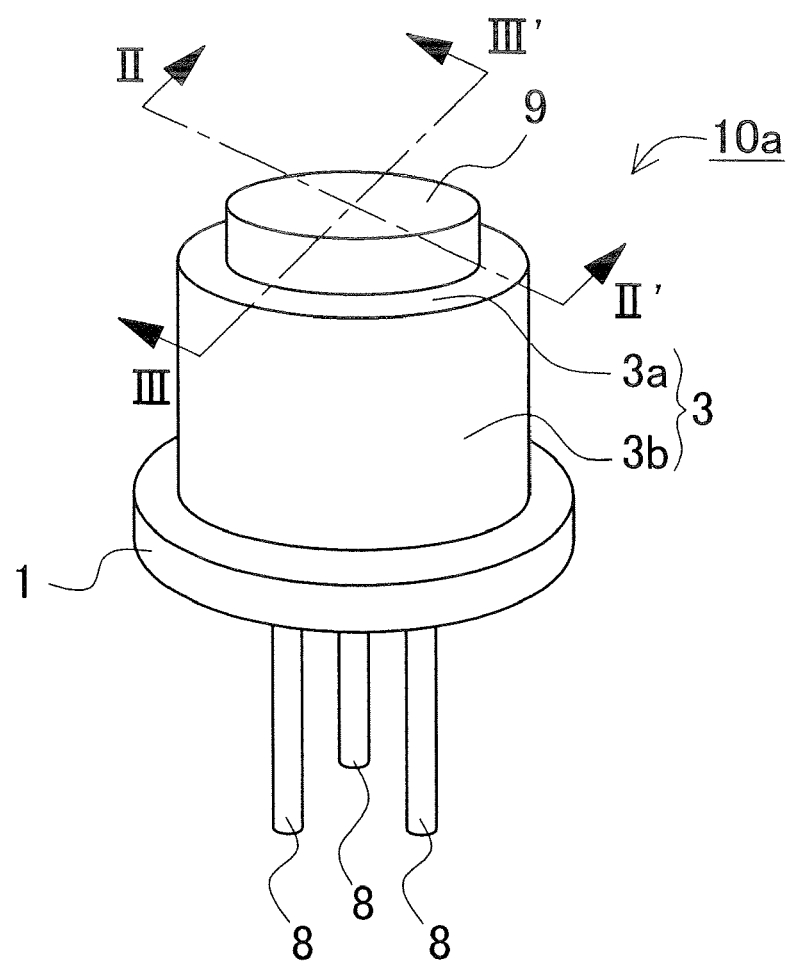
FIG. 1 is a perspective view showing a semiconductor light emitting device according to a first embodiment.

The following description will describe embodiments according to the present invention with reference to the drawings. It should be appreciated, however, that the embodiments described below are illustrations of a semiconductor light emitting device used therein to give a concrete form to technical ideas of the invention, and a semiconductor light emitting device of the invention is not specifically limited to description below. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the arrangement relationships of the members in each of drawings are occasionally shown larger exaggeratingly for ease of explanation. Members same as or similar to those of this invention are attached with the same designation and the same reference numerals and their description is omitted. In addition, a plurality of structural elements of the present invention may be configured as a single part that serves the purpose of a plurality of elements, on the other hand, a single structural element may be configured as a plurality of parts that serve the purpose of a single element.

First Embodiment

Configuration

Figure 2:
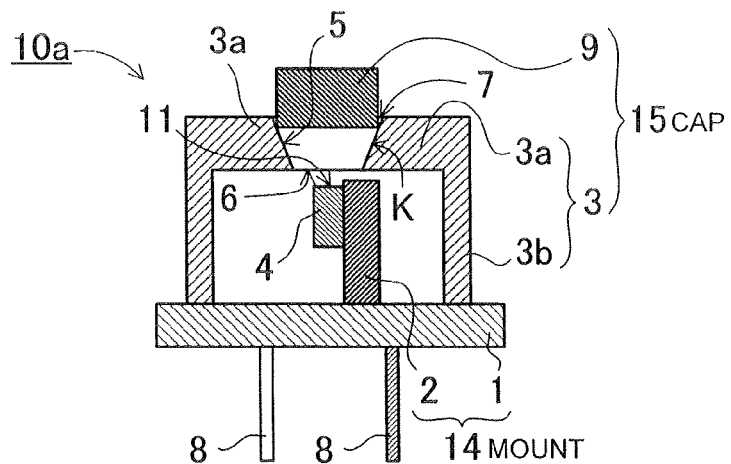
FIG. 2 is a cross-sectional view of the semiconductor light emitting device shown in FIG. 1 taken along the line II-II'.
Figure 3:
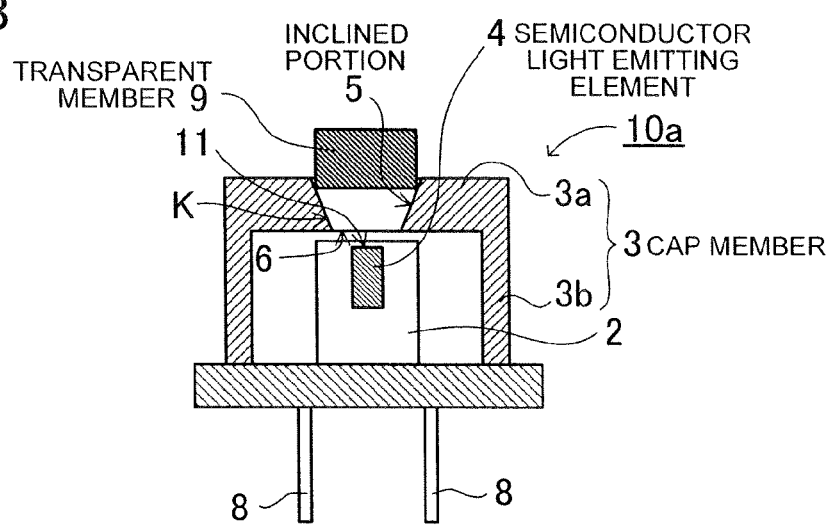
FIG. 3 is a cross-sectional view of the semiconductor light emitting device shown in FIG. 1 taken along the line III-III'.

FIG. 1 is a perspective view showing a semiconductor light emitting device 10a according to a first embodiment. FIG. 2 is a cross-sectional view of the semiconductor light emitting device 10a shown in FIG. 1 taken along the line II-II'. FIG. 3 is a cross-sectional view of the semiconductor light emitting device 10a shown in FIG. 1 taken along the line III-III'. In the semiconductor light emitting device 10a, as shown in FIG. 1, leads 8 extend in the vertical direction from the bottom surface (lower surface in FIG. 1) of the disk-shaped stem base 1. The leads 8 can be electrically connected to external terminals. A cylindrical cap member 3 is adhered onto the upper surface (upper surface in FIG. 1) of the stem base 1 in proximity to the periphery of the stem base 1 so that the center axis of the cylindrical cap member 3 extends in the vertical direction. The cap member 3 has an annular upper surface 3a that is coupled to the upper rim of a side surface 3b of the cap 3. A penetrating opening K is formed in the central part of the upper surface 3a of the cap member 3 in the thickness direction of the upper surface 3a of the cap to communicate the interior side to the exterior side of the cap member 3. The penetrating opening K has an inclined portion 5. In addition to this, as shown in FIG. 2, in the semiconductor light emitting device 10a according to the first embodiment, a transparent member 9 is arranged in proximity to the inclined portion 5. A component that is composed of the transparent member 9 and the cap member 3 is referred to as a cap 15.

Also, as shown in FIG. 2, a bar-shaped stem member 2 is arranged on the upper surface of the stem base 1 inside the cap member 3 to stand in an upright position. A semiconductor light emitting element 4 is mounted to the side surface of the bar-shaped stem member 2 with an adhesive material such as Au—Sn. In addition to this, although not illustrated, wire or the like connects the semiconductor light emitting element 4 to the leads 8 so that the semiconductor light emitting element 4 can be connected to the external terminals. Also, the semiconductor light emitting element 4 is arranged in the substantially central part of the cap member 3 in the width direction (horizontal direction in FIGS. 2 and 3). As a result, the bar-shaped stem member 2 that fixedly retains the semiconductor light emitting element 4 is eccentrically arranged from the central part of the stem base 1 toward the periphery of the stem base 1. Note that the stem base 1 and the bar-shaped stem member 2 are attached with separate designations in accordance with their locations for convenience, and they are not limited to separate components. They can be configured as a unitary component. In this case, it is possible to reduce the number of parts of the semiconductor light emitting device. In this specification, a component that is composed of the stem base 1 and the bar-shaped stem member 2 is referred to as a mount 14.

The shapes of the mount 14 and the cap 15 are not be limited to the shapes shown in FIG. 2, as long as they can seal the semiconductor light emitting element 4. For example, the stem base 1 that composes the mount 14 can have a substantially cylindrical shape that has space in the interior of the stem base, and the cap member 3 that covers the upper part of the stem base can have a substantially disk shape.

Also, the upper surface (upper side in FIGS. 2 and 3) of the semiconductor light emitting element 4 serves as a light emission surface 11. The light emission surface 11 is opposed to the upper surface 3a of the cap member 3. The light emission axis of the semiconductor light emitting element 4 extends substantially coaxially with the center axis of the upper surface 3a of the cap member 3. That is, the center axis of a light beam that is emitted from the semiconductor light emitting element 4 substantially agrees with the center axis of the semiconductor light emitting device 10a. Note that the light emission surface in the present invention does not only refers to a surface that allows light to pass through the whole of the surface, but includes a surface a surface that allows light to pass through a part of the surface. Description will be made for each member.

Semiconductor Light Emitting Element

Various types of elements such as a light emitting diode and a semiconductor laser element can be used as the semiconductor light emitting element 4. In the semiconductor light emitting device 10a according to the first embodiment, a semiconductor laser element is used as the semiconductor light emitting element 4. Since semiconductor laser light has high directivity, the light can be easily guided in one direction. Therefore, emission light from the semiconductor laser element can efficiently outgo from the semiconductor light emitting device 10a. The semiconductor laser element is not specifically limited. The semiconductor laser element can have an active layer that is formed between an n-type semiconductor layer and a p-type semiconductor layer. The active layer forms a multi-quantum-well structure or a single-quantum-well structure. In the case of a blue group semiconductor laser element, the semiconductor laser element is preferably formed of a group III nitride semiconductor.

An example of the semiconductor laser element that is composed of the aforementioned group III nitride semiconductor can be provided by a group III nitride semiconductor laser that includes a nitride semiconductor of non-doped $Al_xGa_{1-x}N$ ($0\leqq x\leqq 1$), an n-type contact layer, a crack preventing layer, an n-type cladding layer, an active layer, a cap layer, a p-type guiding layer, a p-type cladding layer, and a p-type contact layer that are laminated on a substrate. Sapphire, SiC or the like can be used as the substrate. The nitride semiconductor of non-doped $Al_xGa_{1-x}N$ ($0\leqq x\leqq 1$) is grown as a primary layer on the substrate. The n-type contact layer is composed of Si-doped $Al_xGa_{1-x}N$ ($0<x<1$), and is grown on the nitride semiconductor of non-doped $Al_xGa_{1-x}N$ ($0\leqq x\leqq 1$). The crack preventing layer is composed of Si-doped $In_xGa_{1-x}N$ ($0\leqq X\leqq 1$), and is grown on the n-type contact layer. Note that the crack preventing layer can be omitted. The n-type cladding layer has a supperlattice structure that is composed of non-doped $Al_xGa_{1-x}N$ ($0\leqq X\leqq 1$) and Si-doped GaN, and is grown on the crack preventing layer. The n-type guide layer is composed of GaN. The active layer has a multi-quantum-well structure that is composed of well layers of $In_xGa_{1-x}N$ ($0<x<1$) and barrier layers of Si-doped or non-doped $In_xGa_{1-x}N$ ($0<x<1$). The cap layer is composed of Mg-dope $Al_xGa_{1-x}N$ ($0<X<1$). The p-type guiding layer is composed of non-dope GaN. The p-type cladding layer has a supperlattice structure that is composed of non-doped $Al_xGa_{1-x}N$ ($0\leqq x\leqq 1$) and Mg-doped GaN. The p-type contact layer is composed of Mg-doped GaN. In addition to this, the semiconductor laser element includes a light reflection film that is formed on the end surface of an optical waveguide and is composed of two or more pairs of $SiO_2$ and $TiO_2$ in order that the reflectivity of the semiconductor laser element may be not less than 95%.

In the case where a light emitting diode is used as the semiconductor light emitting element 4, the end surface light emission type diode is favorably used. The end surface light emission type diode is one type of light emitting diode that is categorized in terms of structure, and refers to a light emitting diode that allows light to outgo through the end surface of an active layer of the light emitting diode similarly to the semiconductor laser. In the end surface light emission type diode, the active layer has high reflectivity to provide a light waveguide effect in order that light may outgo through the end surface of the active layer. In the case where the output area of the semiconductor light emitting element 4 is thus narrowed, the output light from the semiconductor light emitting element 4 can be easily guided to the later-discussed inclined portion 5 of the penetrating opening K. As a result, it is possible to increase the light outgoing efficiency of the semiconductor light emitting element 4.

Also, if heat that is generated by the semiconductor light emitting element 4 is stored in use of the semiconductor light emitting element 4, the characteristics of the semiconductor light emitting element 4 may deteriorate, and additionally the life of the semiconductor light emitting element 4 may decrease. In order to prevent this, the semiconductor light emitting device is configured to conduct heat that is generated by the semiconductor light emitting element 4 to the bar-shaped stem member 2 and the stem base 1 that are mechanically and electrically connected to the semiconductor light emitting element 4 so that the heat is dissipated into the atmosphere. That is, the stem base 1 and the bar-shaped stem member 2 serves as a heat sink, and provide a heat dissipation effect.

Accordingly, the material of the mount 14 that is composed of the stem base 1 and the bar-shaped stem member 2 preferably has high conductivity to serve as a thermal conduction medium. Specifically, examples of the material of the mount 14 can be provided by copper, brass, tungsten, aluminum, copper-tungsten alloy and the like. Since the cap member 3 is adhered to the stem base 1 as discussed later, the material of the stem base 1 can be determined in consideration of the material of the cap member 3 and the adhesion to the material of the cap member 3.

Inclined Portion

In the semiconductor light emitting device 10a according to the first embodiment, as shown in FIGS. 2 and 3, the penetrating opening K with the inclined portion 5 is formed in the substantially center of the upper surface (upper side in FIGS. 2 and 3) of the cap member 3 in the thickness direction of the upper surface 3a of the cap member 3 to communicate the interior side to the exterior side of the cap member 3. The center axis of the inclined portion 5 in the opening width substantially agrees with the light emission axis of the semiconductor laser element 4. As for the both opening ends of the inclined portion 5, one opening end where emission light from the semiconductor laser element 4 enters the inclined portion 5 is referred to as a light entering portion 6, the other opening end is referred to as a light outgoing portion 7. The emission light from the semiconductor laser element 4 enters the inclined portion 5 through the light entering portion 6. Entering laser light travels straight, or reflected on the interior surface of the inclined portion 5 one time or a plurality of times so that the light is guided to the light outgoing portion 7 side, and outgoes from the cap member 3 through the light outgoing portion 7. That is, the inclined portion 5 serves as a light guide.

The opening width of the inclined portion 5 is tapered in one direction. As shown in FIGS. 2 and 3, space that is defined by the inclined portion 5 according to the first embodiment has an inverted truncated cone shape. That is, the interior diameter of the space is getting larger in the light traveling direction. However, the opening shape of the inclined portion 5 is not limited to a circular shape. The opening shape of the inclined portion 5 may be an ellipse shape or a polygonal shape. Also, the opening shapes of the light entering portion 6 and the light outgoing portion 7 may be different from each other. For example, if the light entering portion 6 has a rectangular shape to match the shape of the emission surface of the semiconductor light emitting element 4, and the light outgoing portion 7 has a circular shape, circular-shaped outgoing light from the light outgoing portion 7 can be obtained irrespective of the shape of the emission surface of the semiconductor light emitting element 4.

The thus-shaped inclined portion 5 can prevent light that has entered the inclined portion 5 from returning toward the semiconductor light emitting element 4 through the light entering portion 6. The reason is that, even if light that is reflected in the wall surface of the inclined portion 5 returns toward the light entering portion 6, the light is less likely to pass through the light entering portion 6 since the opening diameter of the light entering portion 6 is small. For this reason, it is possible to prevent deterioration of the characteristics of the semiconductor light emitting element 4 caused by the return light. In addition to this, since light that has entered the inclined portion 5 is necessarily guided to the light outgoing portion 7 with a large opening diameter, and the emission light from the semiconductor light emitting element 4 can be fully guided to the light outgoing portion 7 of the inclined portion 5, it is possible to increase light outgoing efficiency.

As for the design of the penetrating opening K in the inclined portion 5, the divergence rate of the opening diameter from the light entering portion 6 to the light outgoing portion 7 can be determined in consideration of the diameters of the light entering portion 6 and the light outgoing portion 7, the thickness of the cap member 3, the reflectivity and the thermal conductivity of the material of the cap member 3 and the like. In addition to the aforementioned shape, the inclined portions 5 can have a shape that has a lager divergence rate in proximity to the light entering portion 6, and a smaller divergence rate in proximity to the light outgoing portion 7. An example of this type of shape can be provided by a curved shape like a dome shape in the case of the inclined portion 5 shown in FIG. 4. The curved inclined portion 5 allows light that is reflected by the inclined portion 5 to travel toward the center of the light outgoing portion 7. Therefore, it is possible to reduce the number of reflection times of the light within the inclined portion 5 and the loss of light. In addition, another example of that type of shape can be provided by a lens-like inclined portion 5 in consideration of collection of the emission light.

The opening area of the penetrating opening K in the inclined portion 5 can be suitably designed based on the angle of divergence of the emission light of the semiconductor light emitting element 4, and the distance between the semiconductor light emitting element 4 and the inclined portion 5. As for the size of the end surface as the light emission surface 11 of the semiconductor light emitting element 4, exemplary ranges of the width, the thickness and the area of the end surface can be provided 0.03 to 0.8 mm, 0.01 to 0.8 mm, 0.0009 to 0.5 mm$^2$, respectively. Also, an exemplary range of the angle of divergence of the emission light from the semiconductor light emitting element can be provided by 10° to 65°. Also, an exemplary range of the distance between the semiconductor light emitting element 4 and the penetrating opening K can be provided by 0.02 to 0.8 mm. Also, exemplary ranges of the opening diameter and the cross-section area of the penetrating opening K can be provided by 0.01 to 0.8 mm and 0.000076 to 0.5 mm$^2$, respectively. The opening diameter and the area of the penetrating opening K are determined based on the angle of divergence of emission light of the semiconductor light emitting element 4, and the distance between the semiconductor light emitting element 4 and the inclined portion. Specifically, the semiconductor light emitting element 4 can be used which has an end surface as shown in Table 1. Also, the semiconductor light emitting element 4 and the penetrating opening K can be combined as shown in Table 2.

TABLE 1

| Semiconductor Light Emitting Element 1 | |
|---|---|
| Width of Element | 0.5 mm |
| Thickness of Element | 0.5 mm |
| Edge Surface Area of Element | 0.25 mm$^2$ |
| Semiconductor Light Emitting Element 2 | |
| Width of Element | 0.2 mm |
| Thickness of Element | 0.085 mm |
| Edge Surface Area of Element | 0.017 mm$^2$ |
| Semiconductor Light Emitting Element 3 | |
| Width of Element | 0.05 mm |
| Thickness of Element | 0.03 mm |
| Edge Surface Area of Element | 0.0015 mm$^2$ |

TABLE 2

| Penetrating Opening 1 | |
|---|---|
| Divergence Angle of Light of Element | 55° |
| Distance betw. Element and Opening | 0.5 mm |
| Diameter of Opening | 0.5 mm |
| Sectional Area of Opening | 0.2 mm$^2$ |
| Penetrating Opening 2 | |
| Divergence Angle of Light of Element | 42° |
| Distance betw. Element and Opening | 0.3 mm |
| Diameter of Opening | 0.23 mm |
| Sectional Area of Opening | 0.04 mm$^2$ |
| Penetrating Opening 3 | |
| Divergence Angle of Light of Element | 55° |
| Distance betw. Element and Opening | 0.05 mm |
| Diameter of Opening | 0.018 mm |
| Sectional Area of Opening | 0.00024 mm$^2$ |

In the semiconductor light emitting device 10a shown in FIGS. 1 to 4, the opening diameter of the light entering portion 6 is not specifically limited as long as almost all the emission light from the semiconductor light emitting element 4 can enter the inclined portion 5. The term "almost all" refer to not less than 80%. In the case of the range not less than 80%, the light outgoing efficiency from the semiconductor light emitting element 4 outward of the semiconductor light emitting device 10*a* is increased. However, in the case where the opening width shape and the area of the light entering portion 6 substantially matches the light emission surface 11 of the semiconductor light emitting element 4, substantially all the emission light with high directivity from the semiconductor light emitting element 4 can be guided into the penetrating opening K, and additionally it is possible to prevent that the light that has entered the penetrating opening K travels backward as return light through the light entering portion 6.

Figure 5:
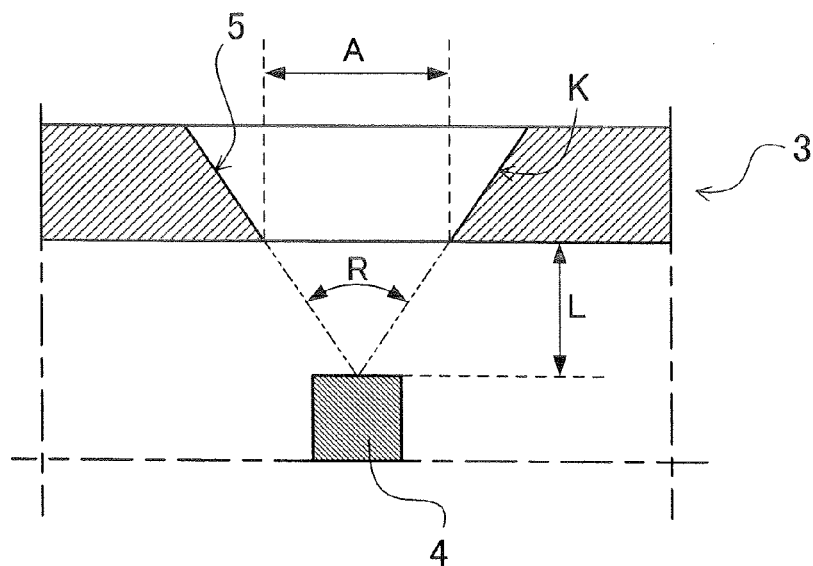
FIG. 5 is a view illustrating the semiconductor light emitting device according to the first embodiment.

In the first embodiment, since the semiconductor laser element is used as the semiconductor light emitting element 4, the opening diameter of the light entering portion 6 can be small. The reason is that, since semiconductor laser elements have high directivity, semiconductor laser element light can be easily guided in one direction. For this reason, the opening diameter is only required to be enough large to allow emission light from the semiconductor laser element to pass through the opening. Therefore, it is not necessary for the light entering portion 6 to be larger than needed. Specifically, the opening part of the light entering portion 6 can have substantially the same shape as the light emission pattern of the semiconductor laser element, or a circular shape. That is, it is only required that the light entering portion 6 has an area for light in consideration of the distance between the semiconductor light emitting element 4 and the light entering portion 6. For example, in the case where the light entering portion 6 has a circular shape in cross section, the area of the light entering portion 6 preferably falls within the range shown by the following Equation.

$$\pi \times \left\{(L-0.2) \times \tan\frac{(R-10)}{2}\right\}^2 \leq A \leq \pi \times \left\{(L+0.2) \times \tan\frac{(R+10)}{2}\right\}^2$$

where, as shown in FIG. 5, A (mm$^2$) is the minimum of the cross-section area of the penetrating opening K in the inclined portion 5 of the cap member 3, L (mm) is the distance between the semiconductor light emitting element 4 and the cap member 3, and R (°) is the angle of divergence of the emission light from the semiconductor light emitting element 4. In case of (L−0.2)≦0, then the left-hand side (lower limit) of the above formula is treated as (L−0.2)=0.001.

In the case where the opening diameter of the light entering portion 6 is thus narrowed, it is possible to further suppress that, when light that has entered the inclined portion 5 is reflected on the wall surface of the inclined portion 5, the light returns toward the semiconductor laser element side. That is, it is possible to remarkably increase the light outgoing efficiency from the semiconductor laser element. In addition to this, it is possible to prevent deterioration of the characteristics of the semiconductor laser element caused by return light incident on the semiconductor laser element. Additionally, since the opening diameter of the light entering portion 6 is small, the increasing rate toward the light outgoing portion 7 side of the opening diameter can be flexibly selected. That is, the flexibility of the inclination angle of the wall surface of the inclined portion 5 is increased.

Since, in the semiconductor light emitting device 10*a* shown in FIGS. 1 to 4, the spacing distance between the semiconductor light emitting element 4 as a heat source and the cap member 3 is large as compared with that in the case where the semiconductor light emitting element 4 is arranged in a conventional inclined portion, it is possible to reduce damage caused by heat. On the other hand, if the spacing distance between them is too large, it is difficult to efficiently collect emission light from the semiconductor light emitting element 4 into the inclined portion 5. For this reason, the spacing distance is preferably determined in consideration of the directivity of the semiconductor light emitting element 4.

Material of Penetrating Opening K

As discussed above, since the inclined portion 5 is the interior surface of the penetrating opening K that opens in the upper surface 3*a* of the cap member 3, the material of the wall surface and the like of the penetrating opening K is the same as the cap member 3. The material of the cap member 3 preferably has high thermal conductivity. In this case, in the case where the transparent member 9 is fixedly attached to the inclined portion 5, heat that is generated by the transparent member 9 can be dissipated. Also, in this case, if a wavelength conversion material is contained, heat that is generated by the wavelength conversion material can be dissipated. Specifically, heat that is generated by the transparent member 9 is conducted to the cap member 3, and is then thermally conducted to the stem base 1 that is coupled to the bottom of the side surface 3*b* of the cap member 3 so that the heat is dissipated. That is, heat that is generated by the transparent member 9 is conducted via the cap member 3 to the stem base 1. Also, heat that is generated by the semiconductor light emitting element 4 is conducted via the bar-shaped stem member 2 to the stem base 1 so that the heat is dissipated. In other words, since heat sink members are prepared for different heat sources, heat can be efficiently and independently dissipated.

Examples of the material of the cap member 3 can be provided to improve this heat dissipation effect by SPC, Kovar, aluminum, copper, brass, and ceramic group materials such as alumina, alumina nitride and SiC. Since the bottom of the wall surface of the cap member 3 is adhered to the stem base 1, the material of the cap ember 3 is determined in consideration of adhesion to the material of the stem base 1. Specifically, in the case where the cap member 3 and the stem base 1 are applied with current so that adhesion surfaces of the cap member 3 and the stem base 1 are melted and then bonded to each other, if an iron-nickel-cobalt alloy (Kovar), nickel, and an iron group material such as SUS is used as the material of the cap member 3, the degree of adhesion can be improved.

Transparent Member

The semiconductor light emitting device 10*a* according to the first embodiment shown in FIGS. 1 to 4 includes the transparent member 9. The transparent member 9 has a substantially disk shape. The diameter of the transparent portion 9 is larger than the opening diameter of the light entering portion 6, and is smaller than the opening diameter of the light outgoing portion 7 of the inclined portion 5. Thus, the transparent member 9 is caught by the wall surface in the inclined portion 5. The bottom surface of the transparent member 9 can close the penetrating opening K of the inclined portion 5.

Figure 26:
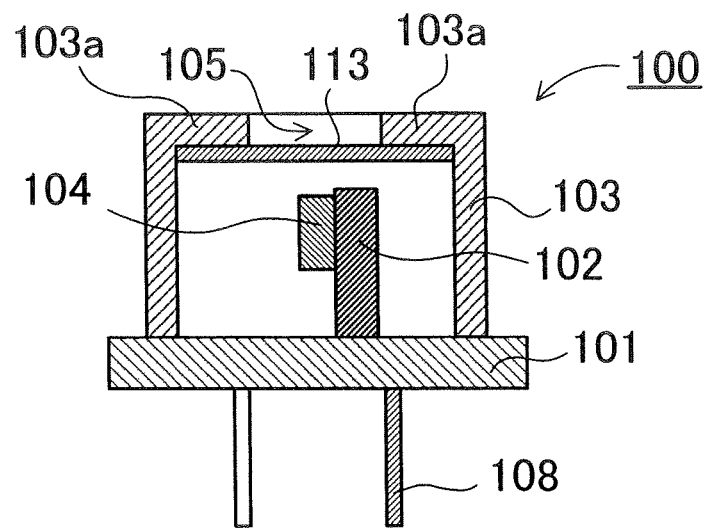
FIG. 26 is a cross-sectional view showing a known semiconductor light emitting device.

On the other hand, in the known semiconductor light emitting device 100, as shown in FIG. 26, when the opening 105 of the cap is closed, the upper surface of the glass 113 is brought into contact with the back surface of the upper surface 103*a* of the cap from the back surface side of the upper surface 103*a*. As compared with this, in the semiconductor light emitting device 10*a* according to the first embodiment shown in FIGS. 1 to 4, since the transparent member 9 is arranged in the opening position of the cap member 3, the opening can be easily closed. Therefore, working efficiency is improved.

Also, the transparent member 9 can be composed of a wavelength conversion material such as a phosphor that is excited by light of the semiconductor light emitting element 4, and emits luminescent radiation. That is, light of the semiconductor light emitting element 4 is converted into light with different wavelength to emit mixed-color light of the light of the semiconductor light emitting element 4 and the light with the wavelength that is converted by the transparent member 9 outward. In other words, selection of the transparent member 9 in accordance with requirement can provide a desired wavelength.

However, the semiconductor light emitting device 10a does not necessarily include the wavelength conversion material. The wavelength conversion material can be used if required. Also, a phosphor can be favorably used as the wavelength conversion member. For example, white light can be provided by using the wavelength conversion material as follows. In a first method, a phosphor that emits yellow light is excited by blue light in a visible short wavelength light range that is emitted by the semiconductor light emitting element 4. Thus, the yellow light corresponding to a part of light that is subjected to wavelength conversion and the blue light that is not subjected to wavelength conversion are mixed so that the two colors that have a complementary color relationship are emitted as white light. In a second method, R, G and B phosphors are excited by light from the ultraviolet range to the visible short wavelength light range that is emitted by the semiconductor light emitting element 4. The three colors that are subjected to wavelength conversion are mixed, and are emitted as white light.

Figure 4:
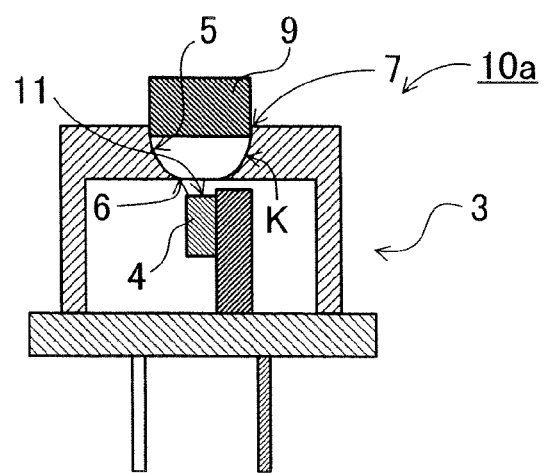
FIG. 4 is a side view showing a semiconductor light emitting device according to a first embodiment.

Typical examples of phosphors can be provided by zinc cadmium sulfide activated by copper, a YAG group phosphor activated by cerium, and an LAG group phosphor. Particularly, in the case of use for high luminance and for a long time, it is preferable to use $(Re_{1-x}SM_x)_3(Al_{1-y}Ga_y)_5O_{12}$:Ce (where, $0 \leq x \leq 1$, $0 \leq y \leq 1$, and Re is at least one element selected from the group consisting of Y, Gd, La and Lu), or the like. A YAG phosphor or an LAG phosphor is used as the wavelength conversion material according to the first embodiment. Phosphor glass with a phosphor in glass, or phosphor-containing resin with a phosphor in the resin may be used. Note that an SPS method or phosphor glass is preferably used in terms of heat resistance. The transparent member 9 according to the first embodiment is composed of a phosphor as the wavelength conversion material that is solidified in a disk shape. As shown in FIGS. 2 to 4, the bottom of the transparent member 9 is fixedly attached to a position of the inclined portion 5 in proximity to the opening of the cap member on the light outgoing portion 7 side by glass, an adhesive material or the like. Thus, the opening of the cap member 3 is closed. The disk-shaped transparent member 9 according to the first embodiment does not seal the whole of the opening of the inclined portion 5, but the wall surface of the inclined portion 5 in proximity to the light outgoing portion 7 supports a bottom peripheral part of the transparent member 9. The upper part, i.e., the light outgoing surface of the transparent member 9 is positioned higher than the top surface of the cap member 3. That is, the transparent member 9 forms a higher part than the top surface of the cap member 3 in a stepped cylindrical shape.

The wavelength conversion material is preferably distributed at uniform density in the transparent member 9. However, the wavelength conversion material may be unevenly distributed so as to partially exist. For example, the wavelength conversion material may be unevenly distributed so that the wavelength conversion material is distributed at small density on the side opposed to the light emission surface 11 of the semiconductor light emitting element 4 and the wavelength conversion material is distributed at high density on the light outgoing surface side of the transparent member 9. Since the wavelength conversion material is distributed to be spaced away from the semiconductor light emitting element 4, heat that is generated in the semiconductor light emitting element 4 and high density light energy are less likely to conducted to the wavelength conversion material. In this case, therefore, it is possible to suppress deterioration of the wavelength conversion material.

Also, in the light emitting device 10a according to the first embodiment, the wavelength conversion material can include two or more kinds of mixed phosphors. That is, the RGB wavelength components can be increased by two or more kinds of mixed phosphors of $(Re_{1-x}SM_x)_3(Al_{1-y}Ga_y)_5O_{12}$:Ce with a different content of Al, Ga, Y, La, Lu, Gd, or Sm. Also, the reddish component can be increased by using a nitride phosphor that emits yellow to red light, and thus it is possible to provide lighting with high general color rendering index Ra, or an LED with electric bulb color. Specifically, with reference to the light-emission wavelength of a light emitting element, the amount of phosphor with a chromaticity point different from the light emitting element on the chromaticity diagram of CIE is adjusted, and thus it is possible to emit light at any point on the chromaticity diagram on the line that is connected between the phosphor and the light emitting element.

A luminescent layer consisting of one layer may include two or more kinds of the thus-formed phosphors. Alternatively, in the case where a luminescent layer consists of two layers, each layer can include one kind of phosphor, or two or more kinds of phosphors. Also, it is preferable that the phosphor is uniformly distributed in the each layer. In this case, the wavelength conversion material can perform uniform wavelength conversion irrespective of parts of the wavelength conversion material. Therefore, it is possible to provide uniform mixture light without unevenness.

Scatter Agent etc.

Also, the transparent member 9 can be added with a suitable material such as a viscosity adjusting agent, a light scattering material, pigment and a phosphor material in accordance with applications, in addition to the wavelength conversion member. Examples of light scattering materials can be provided by barium titanate, titanium oxide, aluminum oxide, silicon oxide, silicon dioxide, heavy calcium carbonate, light calcium carbonate, silver, a mixture containing at least one kind of them, and the like. In this case, it is possible to provide a light emitting device with excellent directivity. Similarly, various types of coloring agents can be added as a filter material that provides a filter effect that cuts off external entering light and light with unnecessary wavelength from the light emitting element.

In the case where the light scattering material is used together with the wavelength conversion material such as a phosphor, light from the light emitting element 4 and light from the phosphor are excellently diffused. Therefore, it is possible to suppress color unevenness that is likely to appear if a phosphor with a large particle size is used. Consequently, favorable use can be provided. Also, a light emission spectral half-value width can be narrow. Therefore, it is possible to a light emitting device with high color purity. A light scattering material with a particle size not less than 1 nm to less than 1 μm has a small interference effect on the wavelength of light from the semiconductor light emitting element 4, but has high transparency, and additionally can increase viscosity of resin without reduction of luminous intensity.

Second Embodiment

Figure 6:
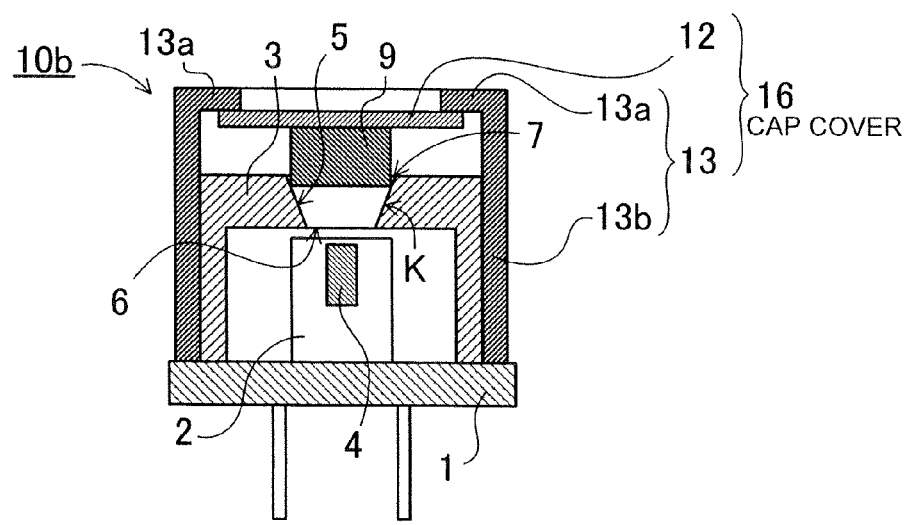
FIG. 6 is a cross-sectional view showing a semiconductor light emitting device according to a second embodiment.

FIG. 6 is a cross-sectional view showing a semiconductor light emitting device 10b according to a second embodiment.

The semiconductor light emitting device 10b includes an additional member in addition to the semiconductor light emitting device 10a according to the first embodiment. Accordingly, the same components as those of the foregoing embodiment are attached with numerals with the same reference numerals as those of the foregoing embodiment and their description is omitted.

Cap Cover

In the semiconductor light emitting device 10b according to the second embodiment, as shown in FIG. 6, a cap cover 16 is additionally mounted outside the cap member 3. The cap cover 16 includes a cylindrical cap cover member 13 that has an opening, and a transparent plate 12 that closes this opening. The cap cover member 13 has a cylindrical side surface 13b and an upper surface 13a that covers the upper part of the side surface 13b. Also, the cap cover member 13 has substantially the same diameter as the diameter of the stem base 1, and is configured in a size larger than the cap member 3 to cover the periphery of the cap member 3. Also, the height of the side surface 13b of the cap cover member 13 is greater than the height of the cap member 3 so that the transparent member 9 is sandwiched between the cap cover member 13 and the cap member 3. The cap cover member 13 is attached to and is in surface contact with the outer wall of the side surface 13b of the cap member 3. Also, the lower end of the side surface 13b of the cap cover member 13 abuts the rim part of the stem base 1 so that the side surface 13b of the cap cover member 13 stands in an upright position. Also, the cap cover member 13 extends at the upper end of the side surface 13b of the cap cover member 13 in a perpendicular direction to the side surface 13b of the cap cover member 13 to cover only the peripheral area of the upper part of the cap cover member 13. In other words, a circular opening is formed in the upper surface 13a of the cap cover member 13 in the central part of the cap cover member 13. Note that the shape of the opening is not limited a circular shape but can be a polygonal shape such as rectangular shape or a desired shape.

As shown in FIG. 6, the position of the opening area of the upper surface 13a of the cap cover member is located in the central part of the upper surface 13a of the cover to agree with the opening area of the inclined portion 5 of the cap member 3. Also, the transparent plate 12 contacts the interior side of the upper surface 13a (i.e., opposed side to the cap member 3) so that the opening area in the upper surface 13a of the cover is closed. The transparent plate 12 according to the second embodiment has a disk shape, and is made of a highly transparent material such as silicon oxide (e.g., quartz and glass), or aluminum oxide (e.g., sapphire), for example. Additionally, the diameter of the transparent plate 12 is larger than the diameter of the transparent member 9. Accordingly, the transparent plate 12 can cover the upper part of the transparent member 9, and can protect the transparent member 9.

Also, the transparent member 9 that is fixedly attached in the light outgoing portion 7 area of the inclined portion 5 is in surface contact with the lower surface of the transparent plate 12. The upper part of the cover upper surface 13a of the cap cover member 13 is fixedly adhered from the upper side onto the periphery portion of the transparent plate 12. The cover upper surface 13a of the cap cover member 13 presses the transparent plate 12 that is in surface contact with the periphery portion of the cover upper surface 13a of the cap cover member 13 toward the transparent member 9. Thus, the transparent member 9 that is supported on the wall surface of the light outgoing portion 7 area of the inclined portion 5 is sandwiched between the transparent plate 12 and the inclined portion 5 that are in surface contact with the upper and lower surfaces of the transparent member 9. Accordingly, the cap cover 16 covers the transparent member 9, and the cap cover member 13, the transparent plate 12, the transparent member 9, and the cap member 3 firmly come in tight contact with each other. Also, since the transparent member 9 is protected by the transparent plate 12 from the external surface side, the shock resistance of the transparent member 9 is increased. In addition to this, it is possible to prevent deterioration of the transparent member 9 caused by the outside air. Favorable examples of materials of the cap cover member 13 that provide the aforementioned effects are provided by copper, brass, SUS, Kovar, aluminum and the like.

Also, the transparent member 9 may not be provided in the inclined portion 5, and a wavelength conversion material such as the phosphor may be mixed in the transparent plate 12. In this case, the number of parts can be reduced, and the semiconductor light emitting device 10b can be small. Alternatively, in the case where the transparent member 9 is located in the inclined portion 5, a wavelength conversion material different from the wavelength conversion material in the transparent member 9 may be mixed in the transparent plate 12. In this case, the semiconductor light emitting device can include a plurality of wavelength conversion materials. In this configuration, the semiconductor light emitting device can emit light in a wider color range.

Third Embodiment

FIG. 7(a) shows a semiconductor light emitting device 10c according to a third embodiment. The semiconductor light emitting device 10c has difference with the semiconductor light emitting device 10a according to the first embodiment in the shape of a transparent member. In other words, the semiconductor light emitting device 10c has configuration similarly to the first embodiment except for the shape of the transparent member. Accordingly, the description of configuration similarly to the first embodiment is omitted.

Figure 7:
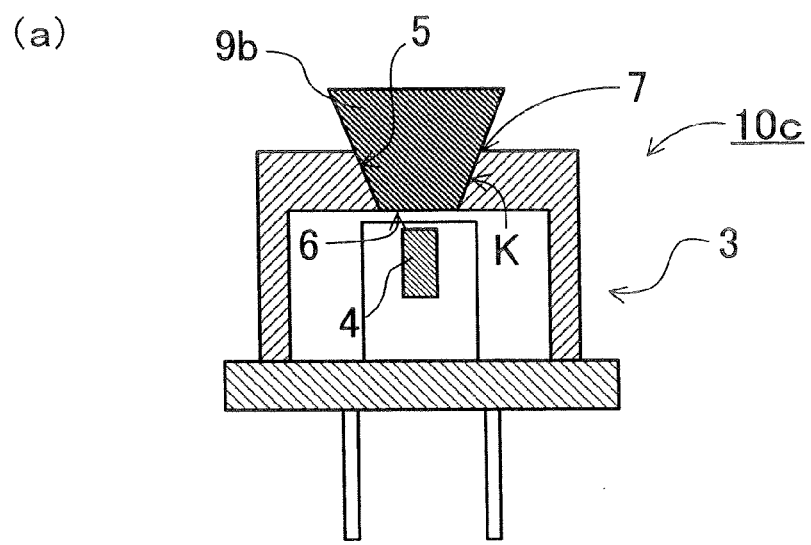
FIG. 7(a) is a cross-sectional view showing a semiconductor light emitting device according to a third embodiment.
FIG. 7(b) is a cross-sectional view showing a semiconductor light emitting device according to a fourth embodiment.
Figure 7:
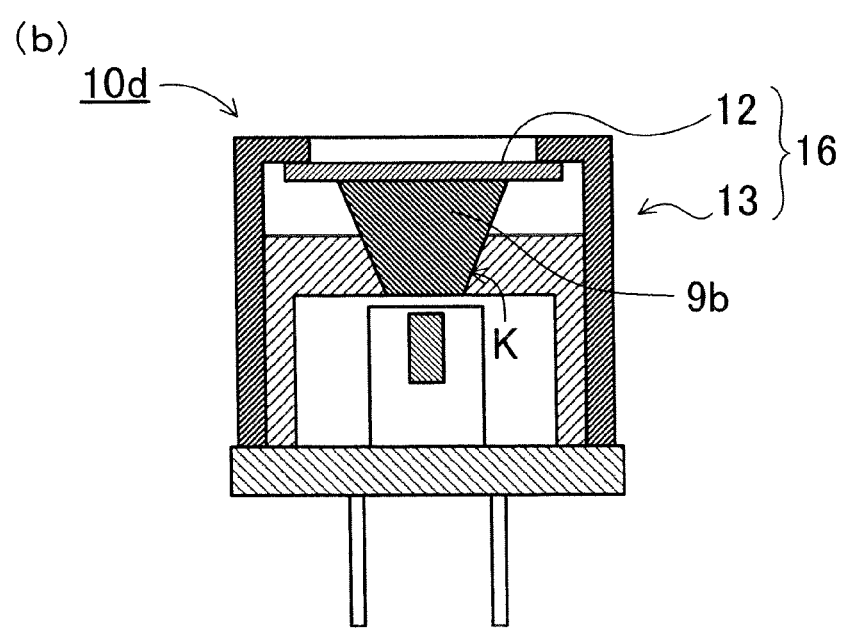

As shown in FIG. 7 (a), in the semiconductor light emitting device 10c according to the third embodiment, a transparent member 9b has a substantially inverted truncated cone shape. The inclination angle of the side surface of the transparent member 9b is the same as that of the inclined portion 5. Thus, the transparent member 9b comes in tight contact with the wall surface of the inclined portion 5. The transparent member 9b closes the penetrating opening K from the light entering portion 6 to the light outgoing portion 7 of the inclined portion 5, and also protrudes upward (upper side in FIG. 7 (a)) of the light outgoing portion 7. That is, the length in the light traveling direction of the transparent member 9b is longer than the length of the inclined portion 5. That is, the length in the light traveling direction of the transparent member 9b is not dependent on the depth of the penetrating opening K of the inclined portion 5. Therefore, the wavelength of the light from the semiconductor light emitting element 4 can be sufficiently converted in the transparent member 9b, and as a result it is possible to reduce the color unevenness of the light that is emitted by the semiconductor light emitting device 10c Also, since the transparent member 9b closes the inclined portion 5, the transparent member 9b comes in surface contact with the entire wall surface of the inclined portion 5. That is, since the contact surface area between the transparent member 9b and the inclined portion 5 is large, heat that is generated from the transparent member 9b can be efficiently conducted to the cap member 3. Therefore, it is possible to improve a heat dissipation effect.

Fourth Embodiment

FIG. 7 (b) shows a semiconductor light emitting device 10d according to a fourth embodiment that is provided, in addition to the semiconductor light emitting device 10c according to the third embodiment 3, with the cap cover 16 that includes the cap cover member 13 and a transparent plate 12. The cap cover 16 has configuration similarly to the second embodiment. Since the cap cover 16 is attached to cover the transparent member 9b, it is possible to protect the transparent member 9b.

Fifth Embodiment

As discussed in the first and third embodiments, the shape of the transparent member 9 to be included as necessary can have a desired shape depending on requirements. Semiconductor light emitting devices 10e, 10f and 10g shown in FIGS. 8(a), 8(b) and 8 (c) include transparent members 9c, 9d and 9e, respectively. The transparent member 9c shown in FIG. 8 (a) is fitted into the inclined portion 5, and closes the inclined portion 5 not to protrude outward and not to recessed inward of the inclined portion 5. That is, the shape of the transparent member 9c is the same as that of the inclined portion 5. Accordingly, the contact surface area between the cap member 3 and the transparent member 9 can be large. Therefore, it is possible to improve the heat dissipation of the transparent member 9.

Figure 8:
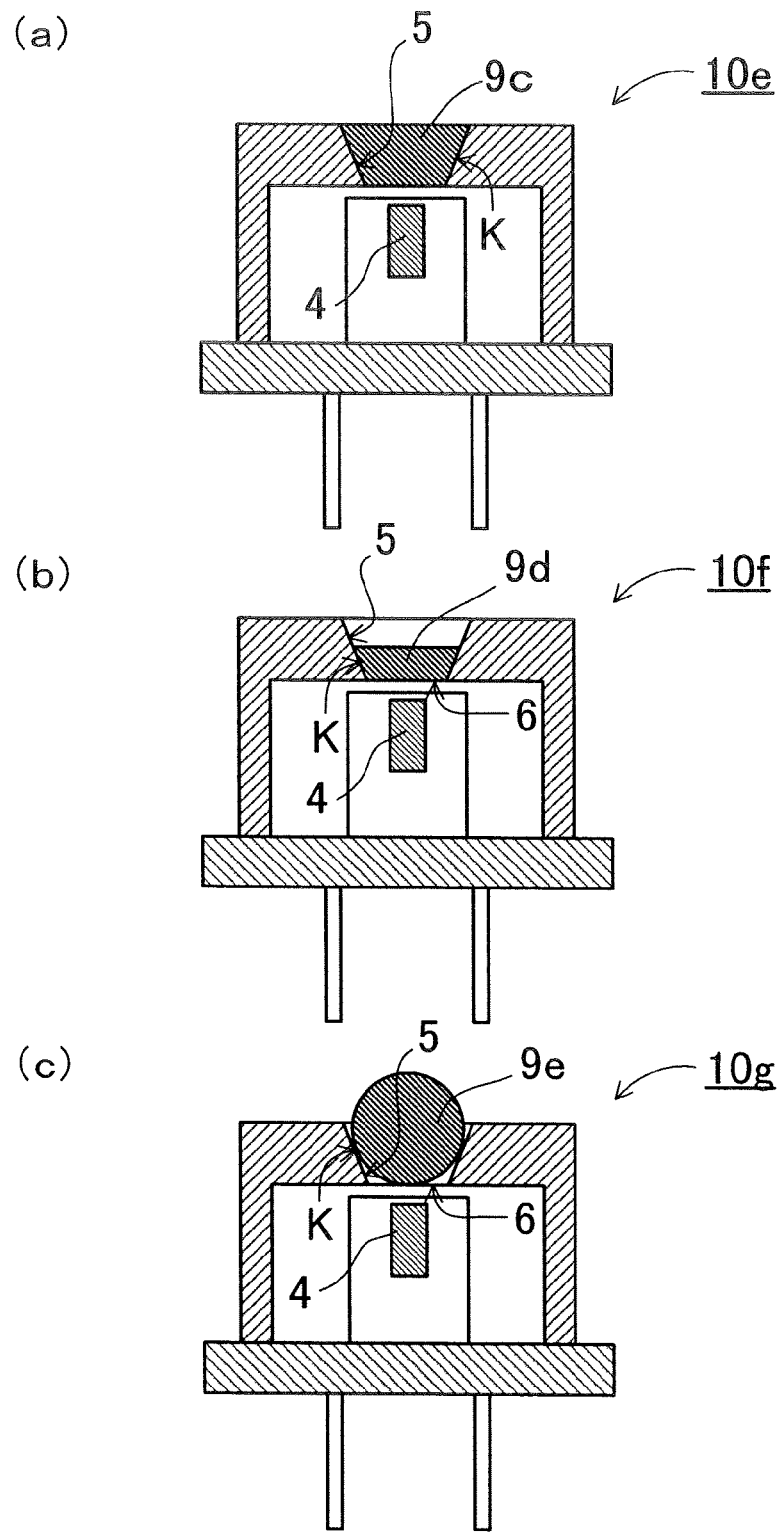
FIG. 8 is a cross-sectional view showing a semiconductor light emitting device according to a fifth embodiment.

Also, as shown in FIG. 8 (b), the transparent member 9d can close only a part in the inclined portion 5. The transparent member 9d according to the fifth embodiment has a substantially inverted truncated cone shape. The inclination angle of the side surface of the transparent member 9d is the same as that of the wall surface of the inclined portion 5. The length in the light traveling direction of the transparent member 9d is shorter than the length of the inclined portion 5. The bottom surface (opposed surface to the semiconductor light emitting element 4) of the transparent member 9d according to the fifth embodiment is substantially coplanar with the light entering portion 6 of the inclined portion 5. Also, the upper surface of transparent member 9d is located inside the penetrating opening K of the inclined portion 5. Thus, the transparent member 9d is positioned at an inward side inside the inclined portion 5. Note that the transparent member 9d inside the inclined portion 5 is not necessarily positioned so that the bottom surface of the transparent member 9d is coplanar with the light entering portion 6 of the inclined portion 5 as long as the transparent member 9d is positioned in the inclined portion 5. In the case where the transparent member 9d is thus attached into the penetrating opening K in the inclined portion 5, it is possible to control the angle of light emission.

Also, the transparent member 9e shown in FIG. 8 (c) has a sphere shape. The diameter of the transparent member 9e is larger than the diameter of the light entering portion 6 of the inclined portion 5. As shown in FIG. 8 (c), the sphere-shaped transparent member 9e is caught in and is supported on the wall surface of the tapered, inclined portion 5. In the transparent member 9e according to the fifth embodiment, however the lowest surface of the transparent member 9e is coplanar with the light entering portion 6, the arrangement of the transparent member 9e is not limited to this. The transparent member 9e may partially protrude outward of the inclined portion 5 as long as the transparent member 9e is not in surface contact with the semiconductor light emitting element 4.

Figure 9:
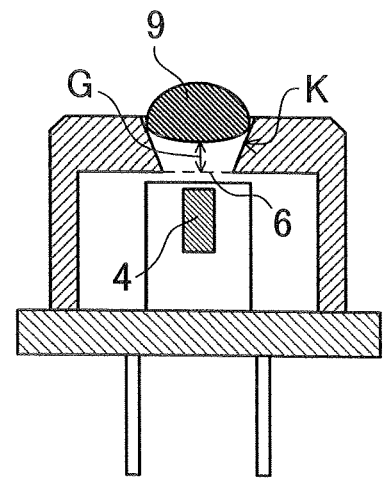
FIG. 9 is a cross-sectional view showing an exemplary semiconductor light emitting device that has space between a transparent member and a light entering portion.
Figure 10:
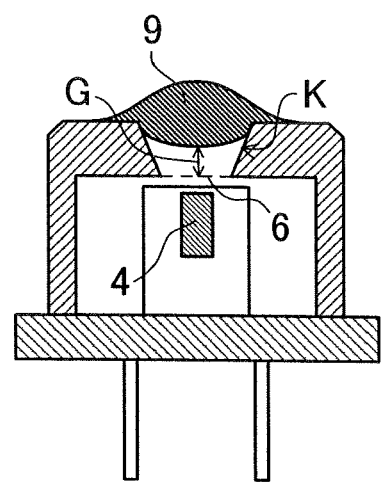
FIG. 10 is a cross-sectional view showing another exemplary semiconductor light emitting device that has space between a transparent member and a light entering portion.
Figure 11:
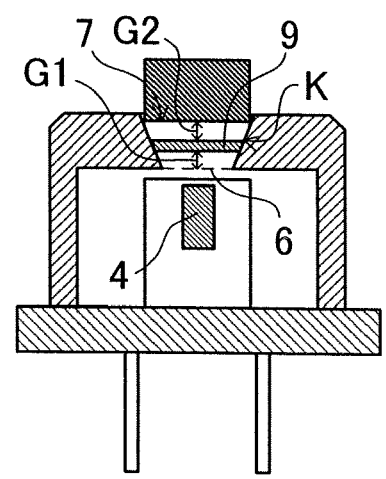
FIG. 11 is a cross-sectional view showing an exemplary semiconductor light emitting device that has space between the lower surface of a transparent member and a light entering portion, and space between the upper surface of the transparent member and a light outgoing portion.

Alternatively, it is also preferable that the bottom surface of the transparent member 9 is positioned higher than the surface of the light entering portion 6 so that the opening part of the penetrating opening K that opens in the cap member still opens as shown in FIG. 6, or 13 to 15. FIGS. 9 and 10 show this arrangement. As shown in these Figures, space G is formed between the bottom surface of the transparent member 9 and the bottom surface (i.e., the light entering portion 6) of the cap member. Accordingly, it is possible to easily guide the emission light from the semiconductor light emitting element 4 through the opening end of the penetration light K, and additionally it is possible to improve an effect in that the inclined surface of the penetration opening K suppresses return light. In the experiment that was conducted by the present inventor, it was found that higher output was obtained in the case where the space G is provided in the light entering portion 6 as compared with the case where the space G is not provided. Also, as shown in FIG. 11, both the upper surface and the lower surface of the transparent member 9 that are attached to the penetrating opening K may be recessed at inward sides of the penetrating opening K. In the example shown in FIG. 11, the distance G1 is defined between the light entering portion 6 and the transparent member 9 bottom surface, and the space G2 is defined between the transparent member 9 upper surface and the light outgoing portion 7. In the case where space is thus provided in each of the upper and lower sides of the transparent member 9, it is possible to improve efficiency. In particular, in the case of G1>G2, it is possible to improve an effect that guides output light from the semiconductor light emitting element 4 to the light entering portion 6.

Also, since the transparent member 9e has a sphere shape as shown in FIG. 8 (c), even if the opening diameters of component as the inclined portion 5 vary due to product-to-product variation, or even if the cap member 3 is deformed by heat that is stored in the cap member 3 so that the opening width of the inclined portion 5 varies, the cap member 3 can be closed without changing the size of the transparent member 9e. The reason is that the transparent member 9e with a sphere-shaped surface can be shifted in the vertical direction in accordance with the opening diameter of the inclined portion 5 to adjust the contact position with the wall surface of the inclined portion 5. In addition to this, since the transparent member 9e has a sphere shape, it is possible to reduce color variation with the angle of light emission.

Note that the transparent member 9e is not limited to a perfect sphere. For example, as shown in FIG. 9, the transparent member can have an asymmetrical spherical shape that has different radii of the curvature so that the surface of the transparent member on the light entering portion 6 is smoothly curved and the surface of the transparent member on the light outgoing portion 7 is largely curved. In particular, since the surface of the transparent member on the light entering portion 6 that is opposed to the semiconductor light emitting element 4 is smoothly curved, the reflection of incident light on this interface can be suppressed. Therefore, it is possible to improve light outgoing efficiency. Also, as shown in FIG. 10, a portion of the transparent member 9 on the light outgoing portion 7 side can be larger than the opening area of the penetrating opening K. In the example shown in FIG. 10, the transparent member 9 is continuously formed so that the base of the transparent member 9 broadly extends from the opening rim of the penetrating opening K on the top surface of the cap member. Accordingly, the transparent member 9 can be surely fastened to the penetrating opening K.

As discussed above, it is favorable to adjust the thickness of the transparent member and the amount of the space in the inclined portion 5 to provide a suitable amount of the wavelength conversion material that converts emission light from the semiconductor light emitting element 4 into a desired wavelength.

Sixth Embodiment

Figure 12:
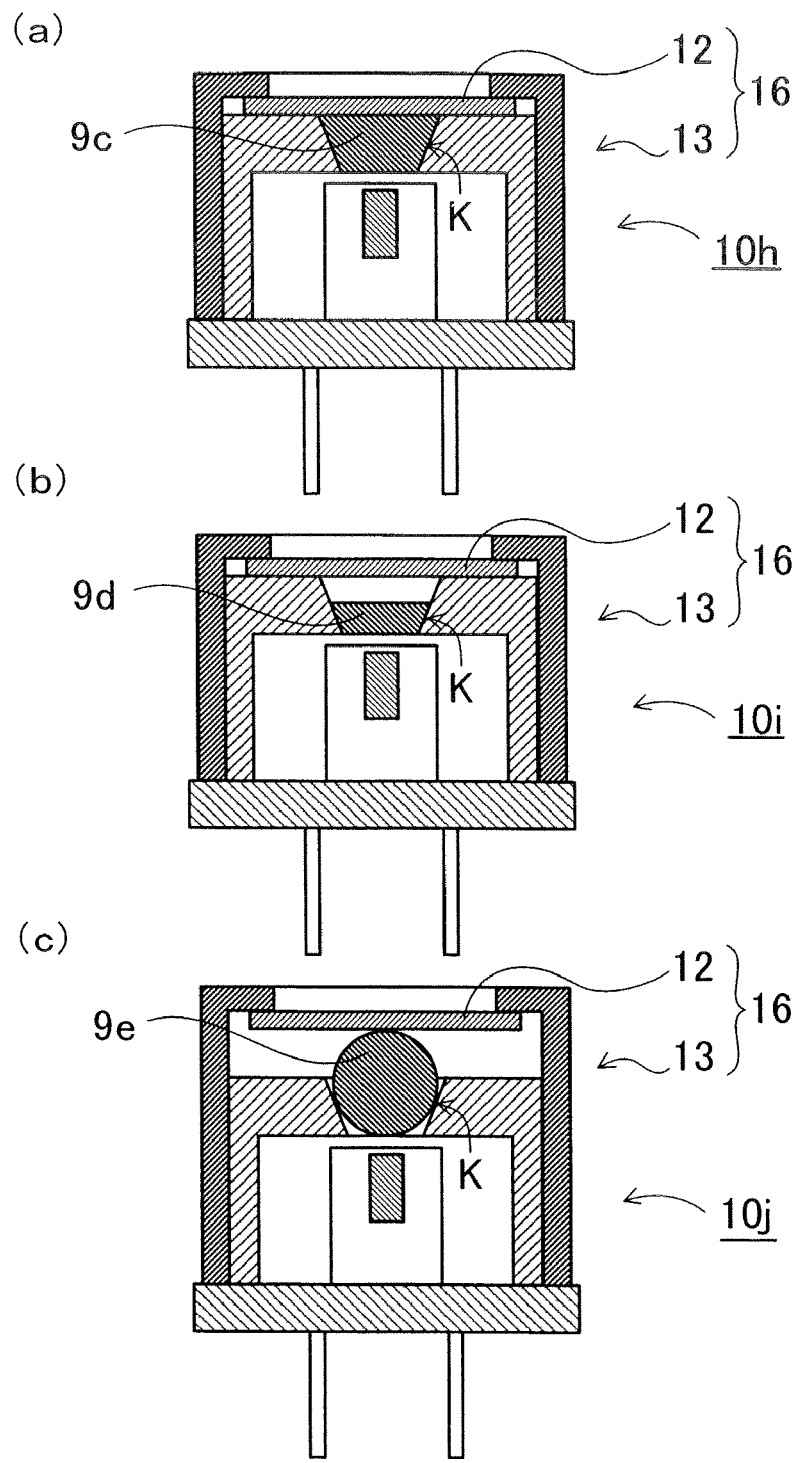
FIG. 12 is a cross-sectional view showing a semiconductor light emitting device according to a sixth embodiment.

The cap cover 16 that includes the cap cover member 13 and the transparent member 12 can be added to the semiconductor light emitting device 10e, 10f or 10g according to the fifth embodiment. FIGS. 12(a), 12(b) and 12 (c) show light emitting device, the semiconductor light emitting devices 10i, 10j and 10h, respectively. The semiconductor light emitting devices 10h, 10i and 10j according to a sixth embodiment include the cap covers 16 that are mounted to the semiconductor light emitting devices 10e, 10f, and 10g according to the fifth embodiment, respectively. The cap cover 16 has configuration similar to that of the second embodiment.

Seventh Embodiment

Figure 13:
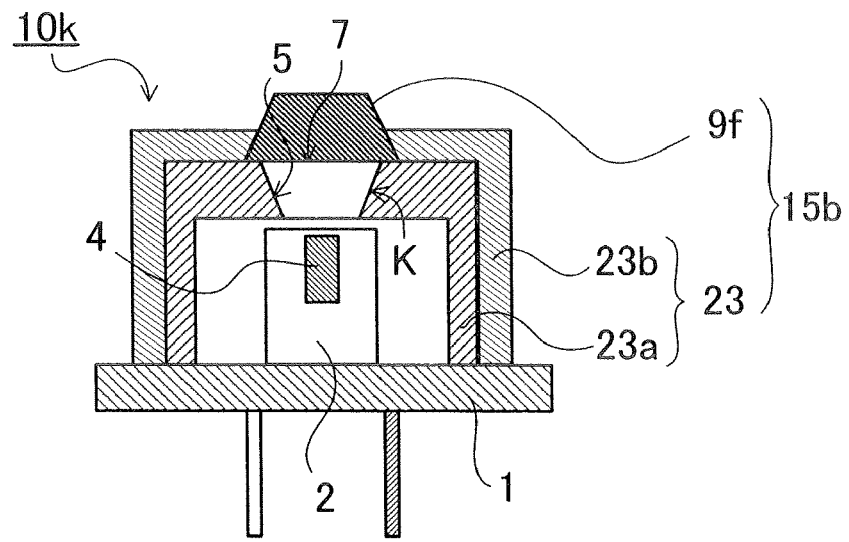
FIG. 13 is a cross-sectional view showing a semiconductor light emitting device according to a seventh embodiment.

FIG. 13 is a cross-sectional view showing a semiconductor light emitting device 10k according to a seventh embodiment. The semiconductor light emitting device 10k has difference with the semiconductor light emitting device 10a according to the first embodiment only in the structure of a cap member 15b. Accordingly, the same components as those of the first embodiment are attached with numerals with the same reference numerals as those of the foregoing embodiment and their description is omitted.

The cap 15b that is included in the semiconductor light emitting device 10k according to the seventh embodiment shown in FIG. 13 includes a transparent member 9f, and a cap member 23 that has two layered portions. This cap member 23 includes a first cap portion 23a and a second cap portion 23b. Note that the cap member 23 is not limited to two layered portions as long as the cap member 23 has multilayered portion.

The first cap member 23a according to the seventh embodiment has the inclined portion 5 with the penetrating opening K formed in the inclined portion 5 similarly to the cap member 3 according to the first embodiment. Also, the second cap member 23b covers the outside of the first cap member 23a. A penetrating opening K is formed in a contact area of the second cap member 23b in contact with the inclined portion 5 of the first cap member 23a. That is, the penetrating openings K of the first cap member 23a and the second cap member 23b communicate to each other.

Also, the transparent member 9f according to the seventh embodiment has a substantially truncated cone shape. The bottom surface of the transparent member 9f is larger than the cross-section area of the penetrating opening K on the light outgoing portion 7 side. Similarly to the first embodiment, a light scattering material, a wavelength conversion material such as a phosphor, and the like can be added to the transparent member 9f. In this embodiment, as shown in FIG. 13, the transparent member 9f is not in contact with the wall surface of the penetrating opening K of the inclined portion 5 in the first cap member 23a but is located on the upper part of the inclined portion 5 to cover the light outgoing portion 7 so that the penetrating opening K is closed. Also, the penetrating opening K of the second cap member 23b has an inclination surface that can fit with the transparent member 9f. The transparent member 9f is caught by this penetrating opening K. That is, the cap member as a first layered portion that is close to the semiconductor light emitting element 4 has the inclined portion, and the transparent member is sandwiched between the cap member as the first layered portion and the cap member as a second layered portion or later that covers the cap member as the first layered portion. Accordingly since the transparent member can be fixed without using a fixing member such as an adherence agent (e.g., an organic material) and low-melting glass, it is possible to simply fix a phosphor glass. Also, the cap cover can be attached to the outside of the semiconductor light emitting device 10k according to the seventh embodiment similarly to the second embodiment.

Eighth Embodiment

Figure 14:
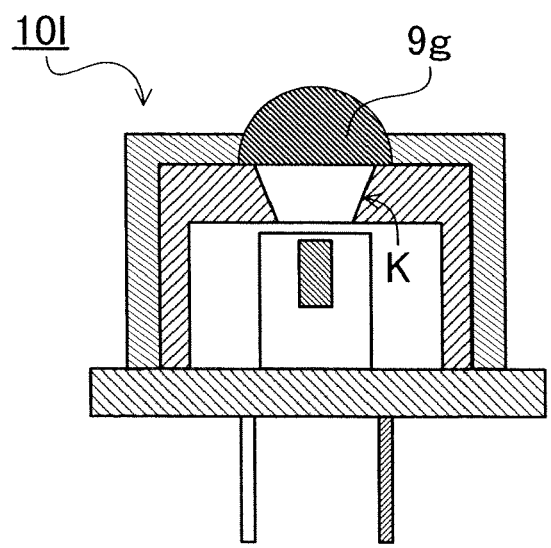
FIG. 14 is a cross-sectional view showing a semiconductor light emitting device according to an eighth embodiment.

FIG. 14 is a cross-sectional view showing a semiconductor light emitting device 10l according to an eighth embodiment. The semiconductor light emitting device 10l includes a transparent member 9g that has a substantially dome shape. The semiconductor light emitting device 10l has similar configuration except for the transparent member 9g. Accordingly, the description of the other configuration of the semiconductor light emitting device 10l is omitted.

Ninth Embodiment

Figure 15:
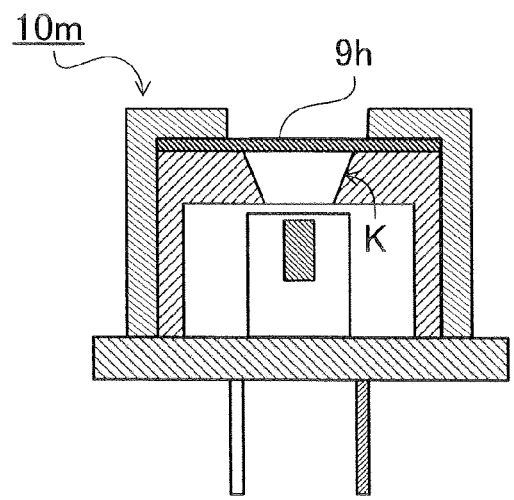
FIG. 15 is a cross-sectional view showing a semiconductor light emitting device according to a ninth embodiment.

FIG. 15 is a cross-sectional view showing a semiconductor light emitting device 10m according to a ninth embodiment. The semiconductor light emitting device 10m includes a transparent member 9h that has a substantially disk shape. The semiconductor light emitting device 10m has similar configuration except for the transparent member 9h. Accordingly, the description of the other configuration of the semiconductor light emitting device 10m is omitted.

Figure 16:
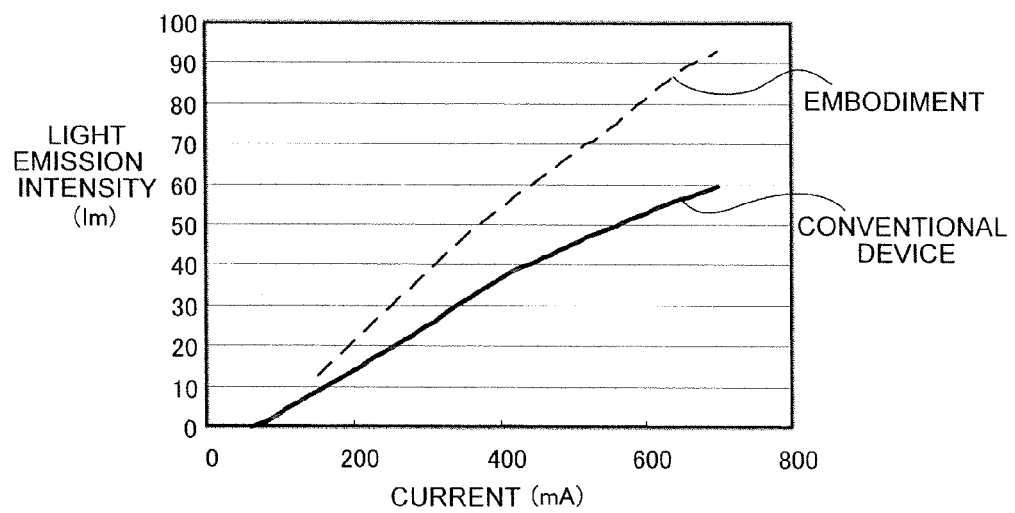
FIG. 16 is a graph showing the light emission intensity characteristics of a conventional device and device to which the present invention is adopted.

FIG. 16 is a graph showing the comparison in light emission intensity between a conventional semiconductor light emitting device and the semiconductor light emitting devices according to the first to ninth embodiments. The conventional semiconductor light emitting device in this case has a light guide with a constant opening width that guides emission light from a light source outward of the semiconductor light emitting device. As shown in FIG. 16, the light emission intensity in these embodiments is higher than that of the conventional device in the all range. In the case where a current of 600 mA is applied, the light emission intensity in these embodiments is about 1.5 times the conventional device. That is, an effect that improves light outgoing efficiency is found.

Tenth Embodiment

Figure 17:
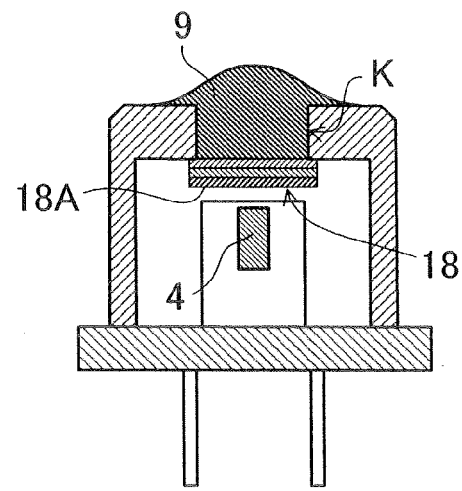
FIG. 17 is a cross-sectional view showing a semiconductor light emitting device according to a tenth embodiment.

Light Selection Filter 18
Also, in addition to the inclined surface that is formed in the penetrating opening K, a light selection filter 18 can also be disposed on the light entering portion 6 side of the penetrating opening K in another embodiment that suppresses a return part of light that is emitted by the semiconductor light emitting element. FIG. 17 shows the structure in a tenth embodiment. In this embodiment, an exemplary band-pass filter 18A as the light selection filter 18 is used which has wavelength selectivity that allows emission light from the semiconductor light emitting element 4 to pass through the band-pass filter 18A but does not allow converted light to pass through the band-pass filter 18A. The converted light is subjected to wavelength conversion by the wavelength conversion material contained in the transparent member 9. The wavelength band is selected based on the main wavelength of the semiconductor light emitting element 4 and the wavelength of the fluorescent radiation by the wavelength conversion material. For example, a material can be used which reflects light in a range of 350 to 800 nm. A dielectric multilayer film can be used as this type of wavelength selection filter. The dielectric multilayer film includes high and low refractive index material layers that are alternately laminated on each other. An example of the dielectric multilayer film can be provided which contains at least one material selected from the group consisting of AlN, SiO$_2$, SiN, ZrO$_2$, SiO, TiO$_2$, Ta$_2$O$_3$, Al$_2$O$_3$, Nb$_2$O$_5$, GaN, MgF$_2$, TiO, Ti$_2$O$_3$, Ti$_3$O$_5$, CeO$_2$, ZnS and the like.

Eleventh Embodiment

Figure 18:
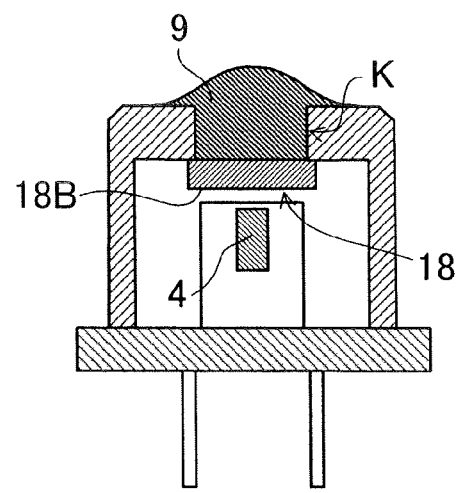
FIG. 18 is a cross-sectional view showing a semiconductor light emitting device according to an eleventh embodiment.

Alternatively, the light selection filter 18 can has phase selectivity. That is, a polarizing filter 18B is used which allows light with a given phase from the semiconductor light emitting element 4 to pass through the polarizing filter 18B but does not allow fluorescent radiation to pass through the polarizing filter 18B. The light with a given phase corresponds to light with a plane of polarization that can pass through the polarizing filter 18B. FIG. 18 is the structure in an eleventh embodiment. In particular, in the case where a laser device is used as the semiconductor light emitting element 4, since laser light is likely to have a uniform plane of polarization, this embodiment is useful. In addition to a non-variable polarizing plate, a liquid crystal filter that can change its light transmission spectrum characteristic in accordance with an applied voltage can be also used the polarizing filter 18B.

Figure 19:
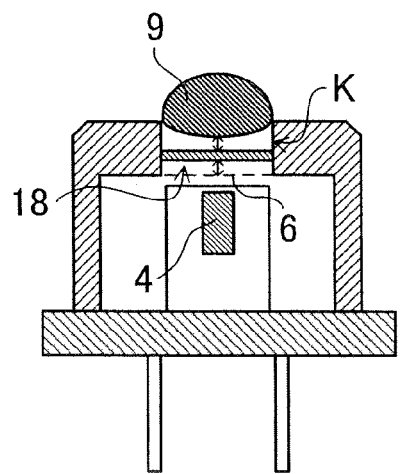
FIG. 19 is a cross-sectional view showing an exemplary semiconductor light emitting device that has space between a light selection filter and a light entering portion.

These types of light selection filters 18 may be formed on a transparent member such as glass. In the examples shown in FIG. 17 and FIG. 18, the light selection filter 18 is fastened on the light entering portion 6 side of the penetrating opening K to close the penetrating opening K. Alternatively, as shown in FIG. 19, the light selection filter 18 can be fastened inside the penetrating opening K so that the space G is formed between the light entering portion 6 and the light selection filter 18. In this case, it is possible to provide a guiding effect for emission light from the semiconductor light emitting element 4.

Figure 20:
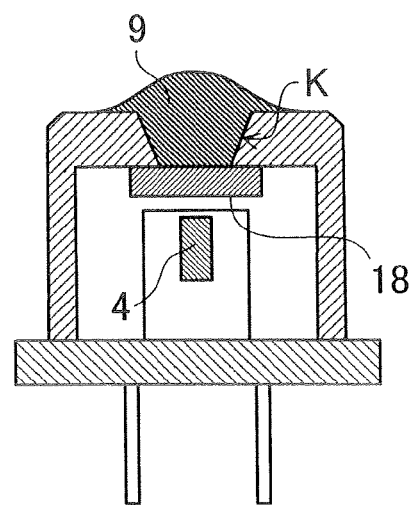
FIG. 20 is a cross-sectional view showing an exemplary semiconductor light emitting device that includes a light selection filter that is arranged in a penetrating opening with an inclined portion that is formed in the penetrating opening.
Figure 21:
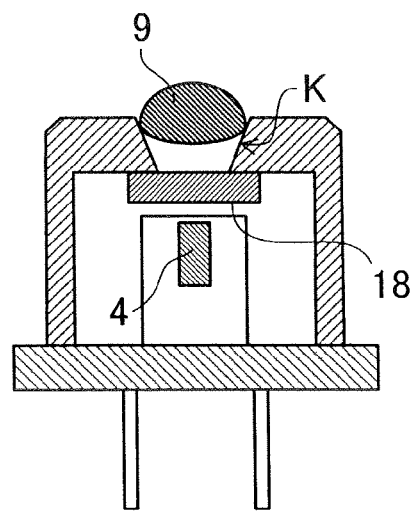
FIG. 21 is a cross-sectional view showing another exemplary semiconductor light emitting device that includes a light selection filter that is arranged in a penetrating opening with an inclined portion that is formed in the penetrating opening.

Also, these types of light selection filters 18 can be combined with the aforementioned penetrating opening K that has the inclined surface as the interior surface of the penetrating opening K. FIGS. 20 and 21 show thus-configured exemplary devices. In these devices, it is possible to further improve an effect that reduces return light and to improve efficiency.

Figure 22:
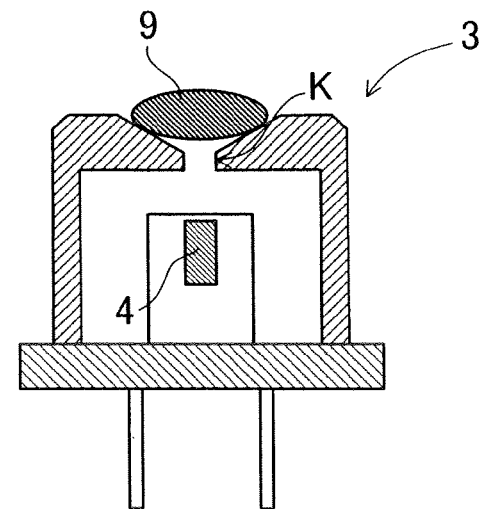
FIG. 22 is a cross-sectional view showing an exemplary semiconductor light emitting device that has a penetrating opening with an inclined portion that is partially formed in the penetrating opening.

The inclined surface is not necessarily formed in the whole interior surface of the penetrating opening K. The inclined surface can be partially formed in the interior surface of the penetrating opening K. FIG. 22 shows a thus-configured exemplary device. In this device, the angle of the inclined surface can be large, and the thickness of the upper surface 3a of the cap member 3 can be maintained. That is, if the angle of the inclined surface is large, the upper surface 3a of the cap member 3 is necessarily thin. However, if the upper surface 3a is too thin, the strength of the upper surface 3a becomes poor. For this reason, a vertically straight portion that is not inclined is formed in the penetrating opening K. The thus-configured straight portion can solve the above problem. Also, as shown in FIG. 22, it is preferable to form inclined surface in the penetrating opening K on the upper side (i.e., side where the transparent member 9 is attached) of the cap member 3, and to form a cylindrical portion with a constant diameter in the penetrating opening K on the interior side (i.e., side opposed to the semiconductor light emitting element 4) of the cap member 3. Thus, the opening end of the penetrating opening K on the upper surface side can be an obtuse angle. Accordingly, it is possible to provide ease of attachment of the transparent member 9 and reduction of return light. In addition to this, since the opening end of the penetrating opening K on the interior side of the cap member 3 is formed in a vertical cylindrical shape, this opening end is not an acute angle. Therefore, there are merits such as ease of formation and elimination of burrs in terms of machining. Note that the edge part of the upper surface 3a of the cap member 3 may be chamfered. In particular, in the case where the cap member 3 covers the cap cover member 13, if the edge part of the upper surface 3a is chamfered, it will be unnecessary to perform machining on the interior surface of the cap cover member 13 at high accuracy.

Calculation of Loss

The thus-configured device can reduce return light and as a result reduces losses. The losses are parts that cannot be used as the output of the semiconductor light emitting device of the whole output of the semiconductor light emitting element 4. Examples of the losses can be provided by a part that is absorbed by members such as the cap member and the transparent plate, a loss when light of the semiconductor light emitting element 4 is subjected to wavelength conversion by the wavelength conversion material (Stokes loss), and a loss of absorption by the wavelength conversion material. Although it is not easy to measure or calculate the loss by return light, it is attempted to quantify the loss by return light by using the following two methods. In this case, the output that can be taken, and losses will be discussed in use of an LD with a rated current $I_{op}$=510 mA, and a rated output $P_{ld}$=500 mW as the semiconductor light emitting element 4.

First, in the case where the output of LD is defined as 100%, the output that can be taken as the output of the semiconductor light emitting device measures 56.03% (of the output of the semiconductor light emitting device, the LD component is 11.59%, and the wavelength conversion material component is 44.44%). Accordingly, the total loss is 43.97%. These values can be obtained by actual measurement. Also, of the total loss, the Stokes loss can be calculated at 11.76% by the following Equation.

$$(\text{Stokes Loss}) = \left( \sum_{LD\text{-}wavelength} A(\lambda) + \sum_{Phos\text{-}wavelength} B(\lambda) \frac{\lambda}{\lambda_{LD-peak}} \right) - \overline{P}$$

where A ($\lambda$): the output of the semiconductor light emitting element corresponding to wavelength in the light emission spectrum that is obtained from the emission light of the semiconductor light emitting device;
B ($\lambda$): the output of the wavelength conversion material after wavelength conversion corresponding to wavelength in the light emission spectrum that is obtained from the emission light of the semiconductor light emitting device;
$\lambda$: wavelength;
$\lambda_{LD-PEAK}$: the peak wavelength of the semiconductor light emitting element,
P: the output that is obtained from the semiconductor light emitting device,
LD-wavelength: the light emission wavelength of the semiconductor light emitting element; and
Phos-wavelength: the light emission wavelength after wavelength conversion by the wavelength conversion material.

If the wavelength conversion material such as a phosphor is not included in the transparent member, most light (not less than 95%) can pass through the transparent member. However, the loss by the wavelength conversion material unavoidably arises. Assuming that the absorption loss by the wavelength conversion material is 10.00% based on an empirical guess, the loss by return light can be calculated at 22.22%. Also, of about 78% as the rest of percentage, the Stokes loss and the phosphor loss are included at about 22%. Accordingly, the part of the light that is actually emitted is about 56%. Therefore, the ratio of return light in the total loss is 50%. As a result, it can be said that, of emission light that is emitted from the semiconductor light emitting element 4, the ratio of a part of the emission light that does not outgo from the semiconductor light emitting device (caused by reflection, absorption, scatter and the like by the transparent member 9) is preferably not more than 22%. The part of the emission light that does not outgo from the semiconductor light emitting device corresponds to the rest of parts of the emission light except for a part of the emission light that passes through the transparent member 9 and outgoes.

Also, on the condition that the same LD is used, the output $P_2$ of the semiconductor light emitting device with the LD is measured, and the output $P_1$ of the LD used singly is measured after the cap cover is removed from the stem. In this case, in the case where the loss by return light is defined as $P_3=P_2-P_1$, from measurement of $P_2=500.34$ mW and $P_1=274.6968$ mW, the loss can be calculated at $P_3=225.6432$ mW. In the case where the output P1 of LD is defined as 100%, the output that can be taken as the output of the semiconductor light emitting device is 55%, and the loss by return light is 45%. As a result, it can be said that, the ratio of the loss by the cap member 3 and the transparent member 4 is not more than 45% of the emission light that is emitted from the semiconductor light emitting element 4.

Since the ratio of the loss by return light is nearly half the total loss in both the calculation results, it can be said that loss by return light is a main factor. Consequently, it can be found that reduction of the loss by return light can contribute output improvement.

Figure 23:
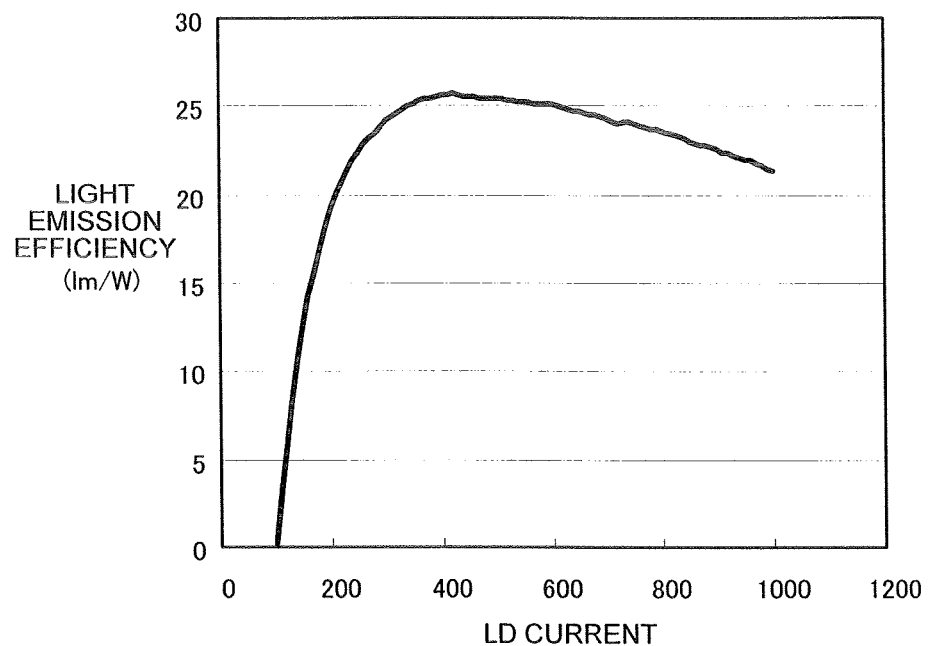
FIG. 23 is a graph showing variation of light emission efficiency against an LD current.
Figure 24:
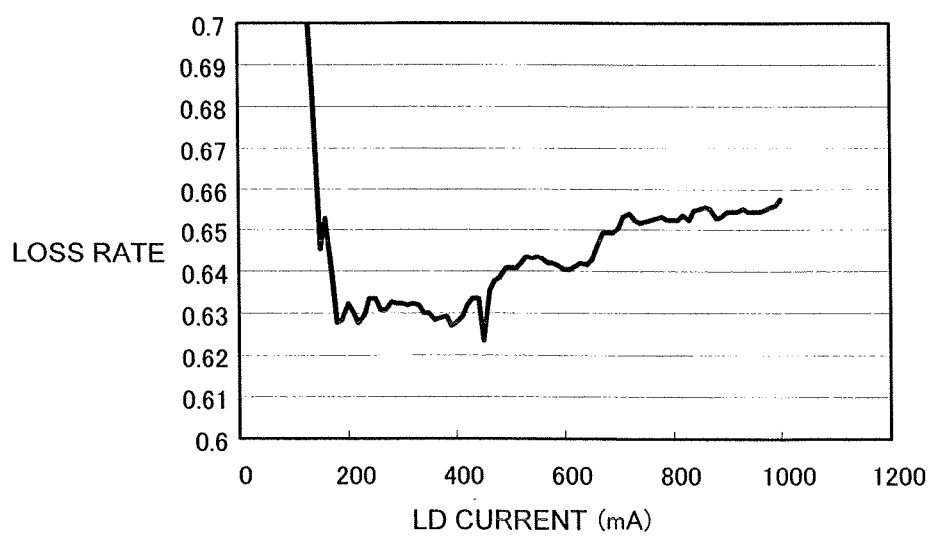
FIG. 24 is a graph showing variation of a loss against an LD current.
Figure 25:
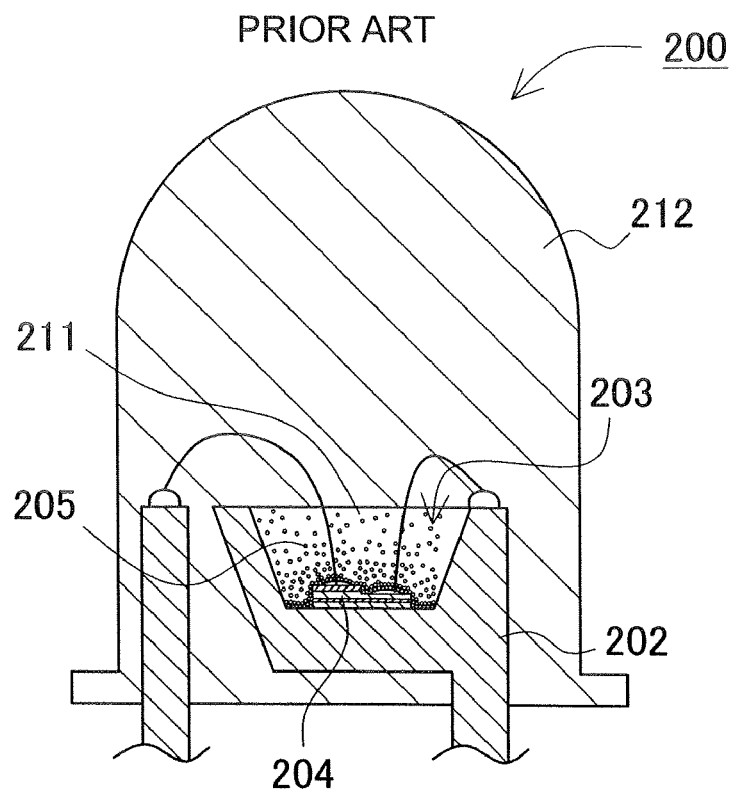
FIG. 25(a) is a cross-sectional view showing a known semiconductor light emitting device.
FIG. 25(b) is a partially enlarged cross-sectional view of the semiconductor light emitting device shown in FIG. 25(a)
Figure 25:
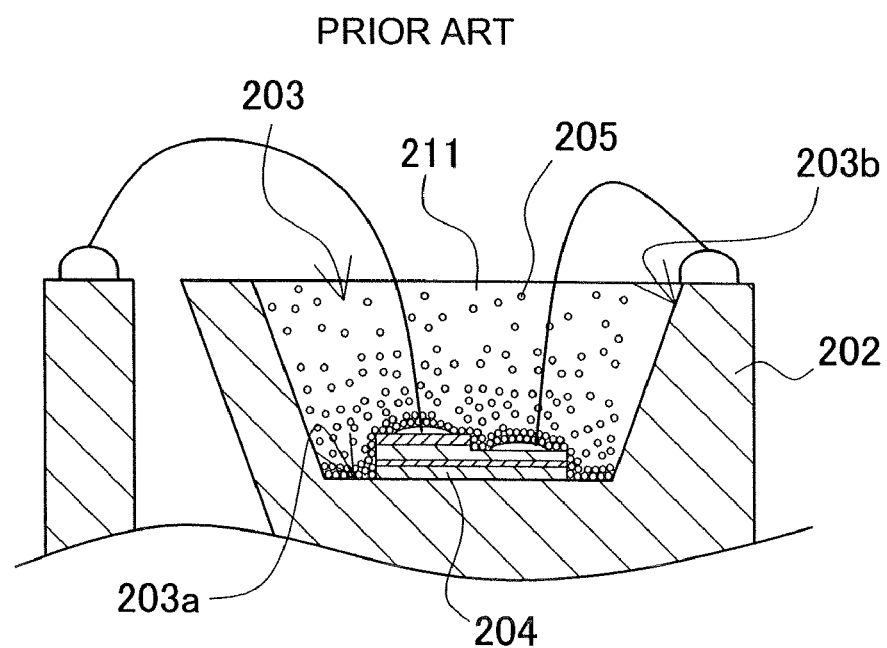

Also, FIGS. 23 and 24 show variation of light emission efficiency and a loss against LD current, respectively. As shown in FIG. 23, the light emission efficiency rises as the LD drive current increases. The light emission efficiency reaches the peak in proximity to 400 mA. After reaching the peak, the light emission efficiency gradually decreases. Also, as shown in FIG. 24, although the variation of the loss is slightly unstable, the loss is high in a small current range, and then drops in proximity to 200 mA. It is found that the loss gradually increase after dropping. From this result, it is considered that the loss can be suppressed to about 63% and after that the efficiency gradually decreases due to heat generation as the drive current of the LD increases. Consequently, it can be said that operation is preferably conducted to suppress the rate of the loss to not more than about 65% in actuality. Also, in this case, it can be said that, in order to reduce the loss and to provide efficient driving operation, the LD is driven in a drive current of 200 mA to 800 mA, preferably 300 mA to 500 mA, and more preferably 350 mA to 450 mA.

The semiconductor light emitting device according to the present invention can be suitably used as a semiconductor laser device that is used for CD, DVD, LBP, a pointer, a bar code scanner, or the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2006-314738 filed in Japan on Nov. 21, 2006, No. 2007-230835 filed in Japan on Sep. 5, 2007, and the contents of which are incorporated herein by reference.

What is claimed is:

1. A semiconductor light emitting device comprising:
a semiconductor light emitting element;
a mount that is provided with the semiconductor light emitting element mounted thereon; and
a cap that includes: a transparent member that allows emission light from the semiconductor light emitting element to pass therethrough; and a cap member that supports the transparent member,
wherein the cap is directly fixed on the mount to define a space therein,
wherein the semiconductor light emitting element is sealed within the space,
wherein the cap member is made from a different material than the transparent member and the cap member has a side surface and an inclined portion in which a penetrating opening is formed in such a manner that the penetrating opening is getting wider toward the outside from the inside where the semiconductor light emitting element is mounted,
wherein the semiconductor light emitting element is disposed outside the penetrating opening,
wherein the transparent member is disposed on the inclined portion and extends outwardly above a top surface of the cap member, and
wherein the side surface and the inclined portion are made of a same material.

2. The semiconductor light emitting device according to claim 1, wherein the transparent member contains a wavelength conversion material that absorbs the emission light from the semiconductor light emitting element and converts the wavelength of the emission light, or a light scattering material that scatters the emission light from the semiconductor light emitting element.

3. The semiconductor light emitting device according to claim 1, wherein the semiconductor light emitting element is spaced apart from the cap.

4. The semiconductor light emitting device according to claim 1, wherein the minimum of the cross-section area of the penetrating opening formed in the inclined portion of the cap member falls within the following range $$\pi \times \left\{ (L-0.2) \times \tan \frac{(R-10)}{2} \right\}^2 \leq A \leq \pi \times \left\{ (L+0.2) \times \tan \frac{(R+10)}{2} \right\}^2$$

where A is the minimum of the cross-section area of the penetrating opening in the inclined portion of the cap member, L is the distance between the semiconductor light emitting element and the cap member, and R is the angle of divergence of the emission light from the semiconductor light emitting element, and
wherein the inclined portion has an interior surface by which the emission light from the semiconductor light emitting element is capable of being reflected and outgoing from the cap member.

5. The semiconductor light emitting device according to claim 1, wherein the inclined portion is formed in a substantially inverted truncated cone shape.

6. The semiconductor light emitting device according to claim 1, wherein the transparent member is fitted in the inclined portion formed in the cap member.

7. The semiconductor light emitting device according to claim 1, wherein the semiconductor light emitting element is a semiconductor laser diode or an edge emitting light-emitting diode.

8. The semiconductor light emitting device according to claim 1,
wherein the transparent member is formed in a substantially truncated cone shape, a substantially dome shape or a substantially disk shape, wherein the cap is provided with multiple layers including two or more layers, and wherein the transparent member is fastened with the multiple layers.

9. The semiconductor light emitting device according to claim 1 further comprising a cap cover that covers the transparent member.

10. The semiconductor light emitting device according to claim 1, wherein a percentage of light which is not output from the semiconductor light emitting device and which is reflected, absorbed, or diffused by the transparent member to whole emission light from the semiconductor light emitting element is not more than 22%.

11. The semiconductor light emitting device according to claim 1, wherein a percentage of loss caused by the cap member and/or the transparent member to whole output light emission from the semiconductor light emitting element is not more than 65%.

12. The semiconductor light emitting device according to claim 1, wherein the transparent member is spaced apart from the semiconductor light emitting element.

13. The semiconductor light emitting device according to claim 1, wherein a diameter of the transparent member is larger than an opening diameter of a light entering portion, the light entering portion being one opening end of the inclined portion through which emission light from the semiconductor light emitting element enters the inclined portion.

14. The semiconductor light emitting device according to claim 1, wherein the side surface is cylindrical, wherein the cap member includes an upper surface and the inclined portion is a portion of the upper surface, and wherein the side surface and the upper surface including the inclined portion thereof are formed of a single unified material.

15. The semiconductor light emitting device according to claim 1, wherein the transparent member contains phosphor as a wavelength conversion material that absorbs the emission light from the semiconductor light emitting element and converts the wavelength of the emission light to white light.

16. A semiconductor light emitting device comprising:
a semiconductor light emitting element;
a mount that is provided with the semiconductor light emitting element mounted thereon; and
a cap that includes: a transparent member that allows emission light from the semiconductor light emitting element to pass therethrough; and a cap member that supports the transparent member,
wherein the semiconductor light emitting element is sealed by the mount and the cap,
wherein the cap member is made from a different material than the transparent member, and the cap member defines a penetrating opening that opens to allow emission light emitted from the semiconductor light emitting element to outgo, and the cap member has a side surface and an inclined portion in which a penetrating opening is formed, the penetrating opening defining one end of the inclined portion as a light entering portion, and another end of the inclined portion as a light outgoing portion,
wherein the semiconductor light emitting element is disposed apart from the penetrating opening, and the light entering portion is positioned between the semiconductor light emitting element and the light outgoing portion,
wherein at least part of the transparent member is disposed inside the penetrating opening,
wherein the transparent member contains a wavelength conversion material that absorbs the emission light from the semiconductor light emitting element and converts the wavelength of the emission light, or a light scattering material that scatters the emission light from the semiconductor light emitting element, wherein a percentage of light which is not output from the semiconductor light emitting device and which is reflected, absorbed, or diffused by the transparent member to whole emission light from the semiconductor light emitting element is not more than 22%, wherein the side surface and the inclined portion are made of a same material, and wherein the transparent member contains phosphor as a wavelength conversion material that absorbs the emission light from the semiconductor light emitting element and converts the wavelength of the emission light to white light.

17. The semiconductor light emitting device according to claim 16, wherein the transparent member is spaced apart from the semiconductor light emitting element.

18. The semiconductor light emitting device according to claim 16, wherein a diameter of the transparent member is larger than an opening diameter of the light entering portion, the light entering portion being one opening end of the inclined portion through which emission light from the semiconductor light emitting element enters the inclined portion.

19. The semiconductor light emitting device according to claim 16, wherein the side surface is cylindrical, wherein the cap member includes an upper surface and the inclined portion is a portion of the upper surface, and wherein the side surface and the upper surface including the inclined portion thereof are formed of a single unified material.

20. The semiconductor light emitting device according to claim 16, wherein the transparent member is disposed on the inclined portion and extends outwardly above a top surface of the cap member.

21. A semiconductor light emitting device comprising:
a semiconductor light emitting element;
a mount that is provided with the semiconductor light emitting element mounted thereon; and
a cap that includes: a transparent member that allows emission light from the semiconductor light emitting element to pass therethrough; and a cap member that supports the transparent member,
wherein the semiconductor light emitting element is sealed by the mount and the cap,
wherein the cap member is made from a different material than the transparent member and the cap member defines a penetrating opening that opens to allow emission light emitted from the semiconductor light emitting element to outgo, and the cap member has a side surface and an inclined portion in which a penetrating opening is formed, the penetrating opening defining one end of the inclined portion as a light entering portion, and another end of the inclined portion as a light outgoing portion,
wherein the semiconductor light emitting element is disposed apart from the penetrating opening, and the light entering portion is positioned between the semiconductor light emitting element and the light outgoing portion,
wherein at least part of the transparent member is disposed inside the penetrating opening,
wherein the transparent member contains a wavelength conversion material that absorbs the emission light from the semiconductor light emitting element and converts the wavelength of the emission light, or a light scattering material that scatters the emission light from the semiconductor light emitting element, wherein of the emission light that is emitted from the semiconductor light emitting element, the ratio of a loss caused by the cap member and the transparent member is not more than 65%, wherein the side surface and the inclined portion are made of a same material, and wherein the transparent member contains phosphor as a wavelength conversion material that absorbs the emission light from the semiconductor light emitting element and converts the wavelength of the emission light to white light.

22. The semiconductor light emitting device according to claim 21, wherein the transparent member is spaced apart from the semiconductor light emitting element.

23. The semiconductor light emitting device according to claim 21, wherein a diameter of the transparent member is larger than an opening diameter of the light entering portion, the light entering portion being one opening end of the inclined portion through which emission light from the semiconductor light emitting element enters the inclined portion.

24. The semiconductor light emitting device according to claim 21, wherein the side surface is cylindrical, wherein the cap member includes an upper surface and the inclined portion is a portion of the upper surface, and wherein the side surface and the upper surface including the inclined portion thereof are formed of a single unified material.

25. The semiconductor light emitting device according to claim 21, wherein the transparent member is disposed on the inclined portion and extends outwardly above a top surface of the cap member.

* * * * *